United States Patent
Assefa et al.

(10) Patent No.: US 8,912,032 B2
(45) Date of Patent: Dec. 16, 2014

(54) TEMPERATURE CONTROL DEVICE FOR OPTOELECTRONIC DEVICES

(71) Applicant: International Business Machines Corporation, Armonk, NY (US)

(72) Inventors: Solomon Assefa, Yorktown Heights, NY (US); William M. Green, Yorktown Heights, NY (US); Young-hee Kim, Yorktown Heights, NY (US); Joris Van Campenhout, Brussels (BE); Yurii A. Vlasov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/748,226

(22) Filed: Jan. 23, 2013

(65) Prior Publication Data

US 2013/0137202 A1    May 30, 2013

Related U.S. Application Data

(62) Division of application No. 13/363,995, filed on Feb. 1, 2012, now Pat. No. 8,363,686, which is a division of application No. 12/498,463, filed on Jul. 7, 2009, now Pat. No. 8,111,724.

(51) Int. Cl.
*H01L 21/00*    (2006.01)

(52) U.S. Cl.
USPC .......................................................... 438/57

(58) Field of Classification Search
None
See application file for complete search history.

(56) References Cited

U.S. PATENT DOCUMENTS

| | | | |
|---|---|---|---|
| 6,278,822 B1 | 8/2001 | Dawnay | |
| 6,377,716 B1 | 4/2002 | Veldhuis | |
| 6,694,080 B2 | 2/2004 | Dejneka et al. | |
| 6,970,611 B1 | 11/2005 | Van Der Vliet et al. | |
| 6,985,663 B2 | 1/2006 | Catchmark et al. | |
| 7,142,761 B2 * | 11/2006 | Liu et al. | 385/131 |
| 7,259,106 B2 | 8/2007 | Jain | |
| 7,340,709 B1 | 3/2008 | Masini et al. | |
| 2003/0183267 A1 | 10/2003 | McIntyre et al. | |
| 2005/0207704 A1 | 9/2005 | Keyser et al. | |
| 2005/0266606 A1 | 12/2005 | Chevallier et al. | |
| 2007/0230856 A1 | 10/2007 | Yamazaki | |
| 2008/0315266 A1 * | 12/2008 | Eshun et al. | 257/285 |

FOREIGN PATENT DOCUMENTS

| | | |
|---|---|---|
| GB | 2332284 A | 6/1999 |
| JP | 09179078 | 7/1997 |
| JP | 2003307636 | 10/2003 |

OTHER PUBLICATIONS

Cheng, "Silicon Photonics", Cal Eng, Fall 2006, pp. 15-20.
Chong et al., "Tuning of Photonic Crystal Waveguide Microactivity by Thermooptic Effect", IEEE Photonics Technology Letters, vol. 16, No. 6, Jun. 2004.

(Continued)

*Primary Examiner* — Reema Patel
(74) *Attorney, Agent, or Firm* — Scully, Scott, Murphy & Presser, P.C.; Vazken Alexanian

(57) ABSTRACT

Current may be passed through an n-doped semiconductor region, a recessed metal semiconductor alloy portion, and a p-doped semiconductor region so that the diffusion of majority charge carriers in the doped semiconductor regions transfers heat from or into the semiconductor waveguide through Peltier-Seebeck effect. Further, a temperature control device may be configured to include a metal semiconductor alloy region located in proximity to an optoelectronic device, a first semiconductor region having a p-type doping, and a second semiconductor region having an n-type doping. The temperature of the optoelectronic device may thus be controlled to stabilize the performance of the optoelectronic device.

18 Claims, 27 Drawing Sheets

(56) References Cited

OTHER PUBLICATIONS

Park et al., "A Hybrid AlGaInAs-Silicon Evanescent Amplifier", IEEE Photonics Technology Letters, Feb. 15, 2007, pp. 230-232, vol. 19, No. 4.

Paniccia et al., "Intel's Research in Silicon Photonics Could Bring High-Speed Optical Communication to Silicon", Research and Development at Intel, Feb. 2004, pp. 1-6.

Van Campenhout et al., "Electrically pumped InP-based microdisk lasers integrated with a nanophotonic silicon-on-insulator waveguide circuit", Optics Express, May 28, 2007, pp. 6744-3749, vol. 15, No. 11.

Vlasov et al., "Multidisciplinary Sciences", Journal: Nature, Nov. 3, 2005, pp. 65-69, vol. 438, No. 7064, Nature Publishing Group (Abstract Only).

Zhang et al., "Superlattice Microrefrigerators Fusion Bonded With Optoelectronic Devices" IEEE Transactions on Components and Packaging Technologies, Dec. 2005, pp. 658-666, vol. 28, No. 4.

International Search Report dated Oct. 21, 2010 issued in corresponding International Application No. PCT/EP2010/059571.

\* cited by examiner

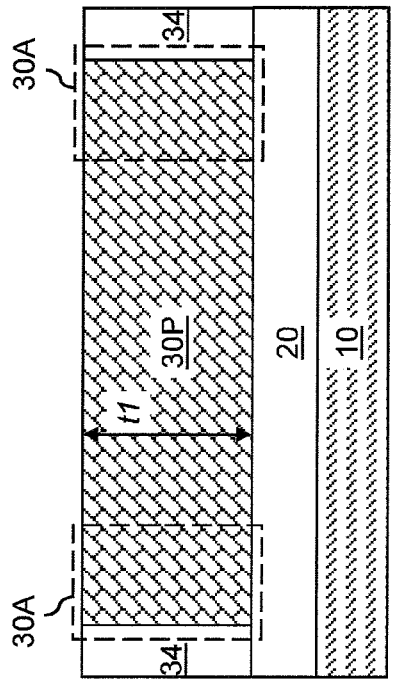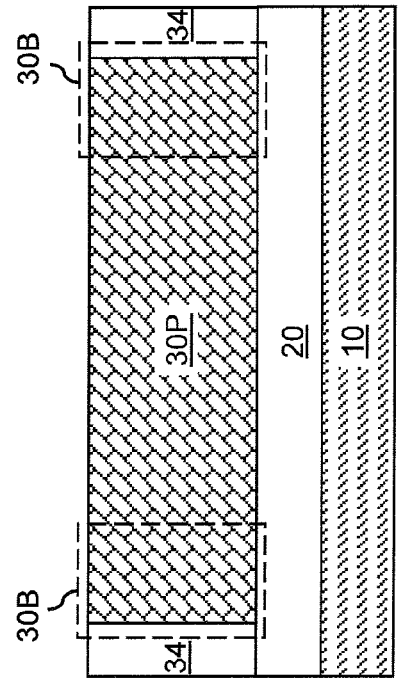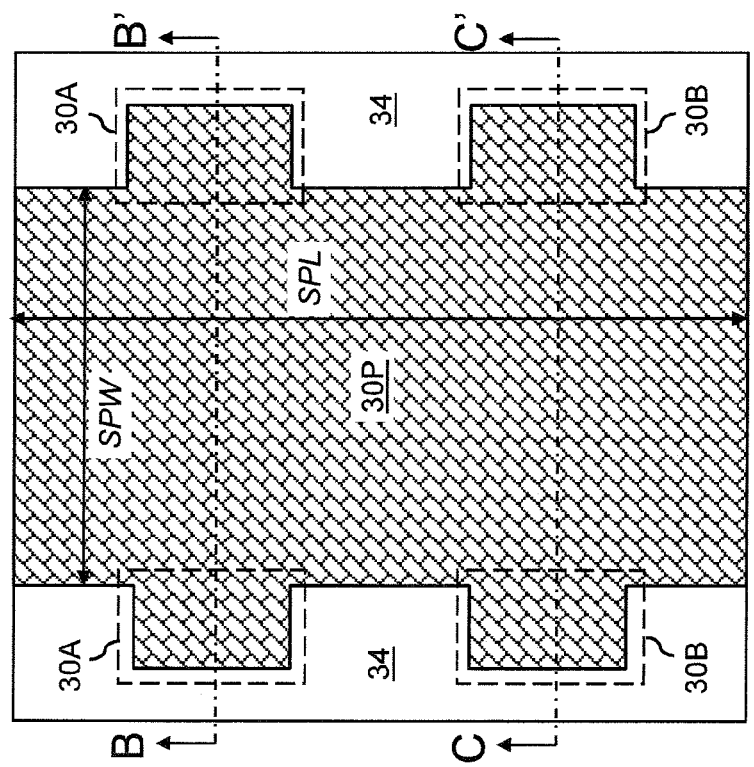

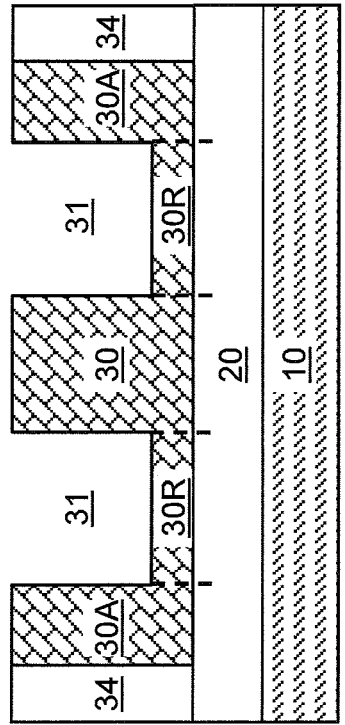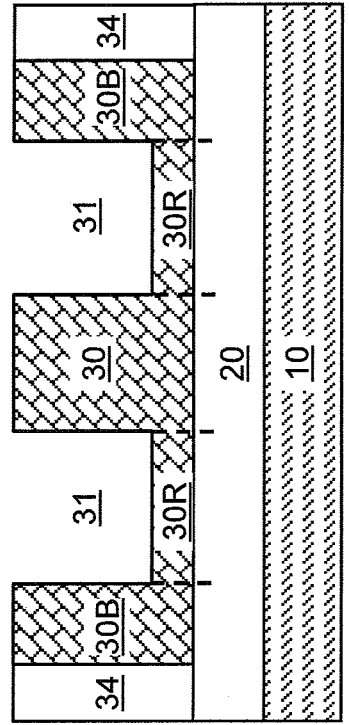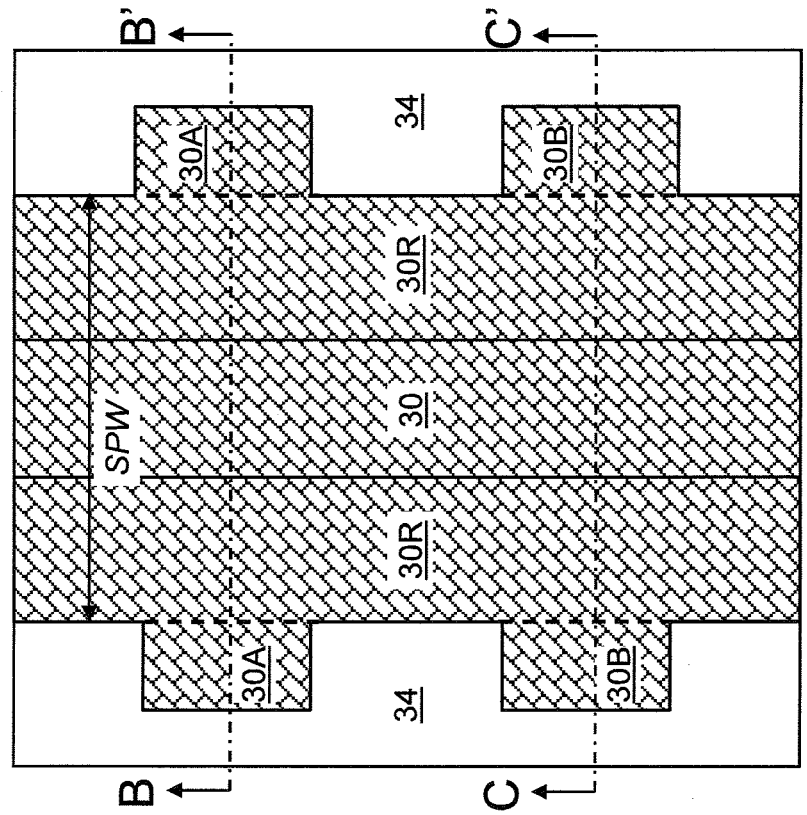

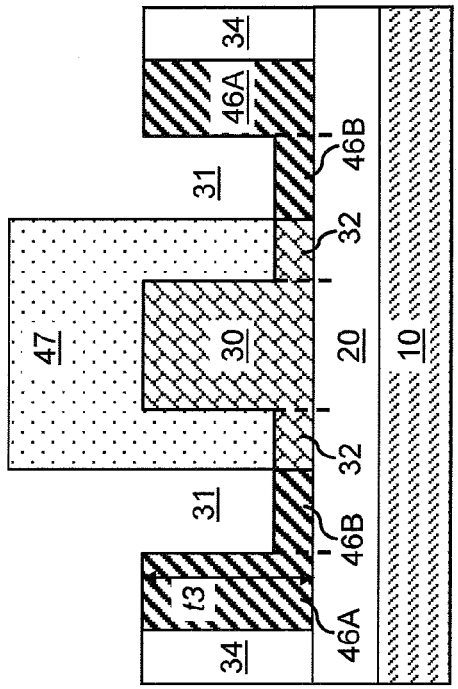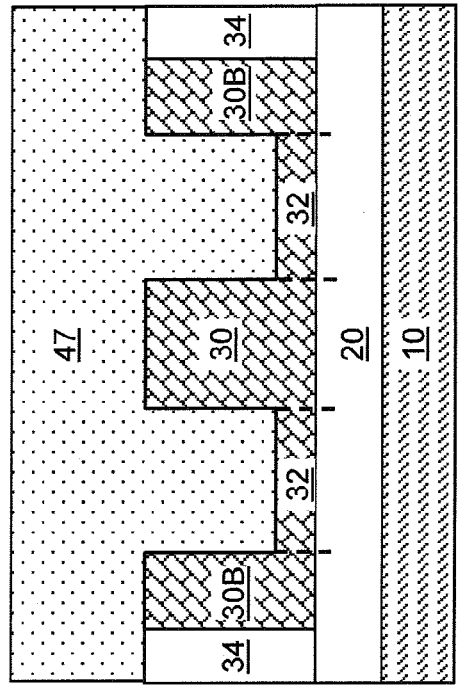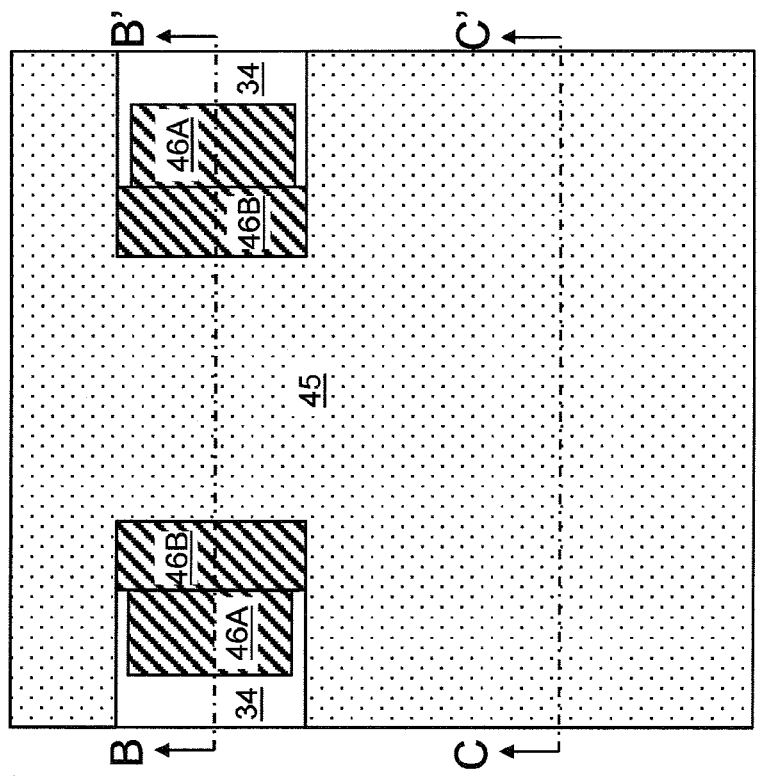

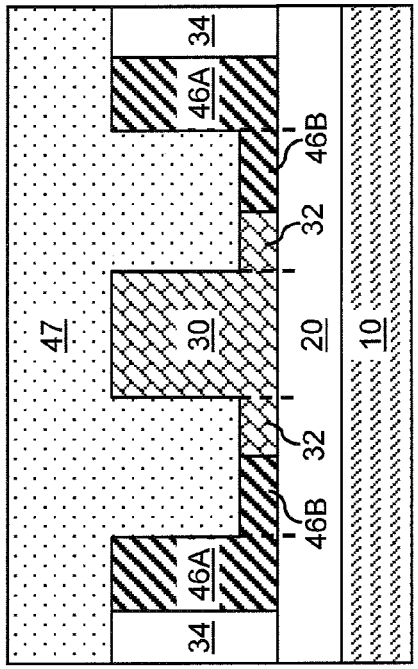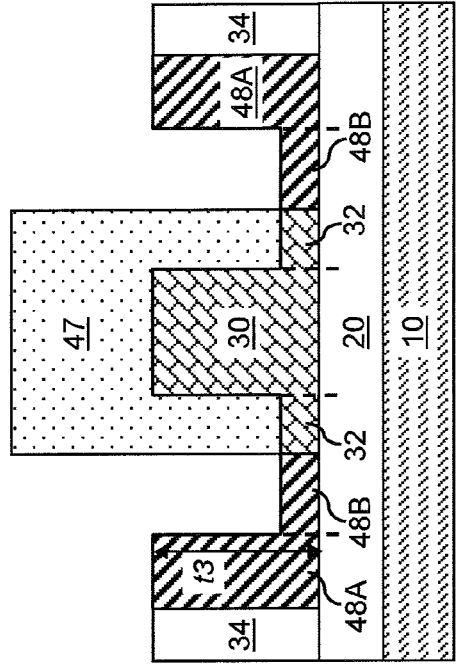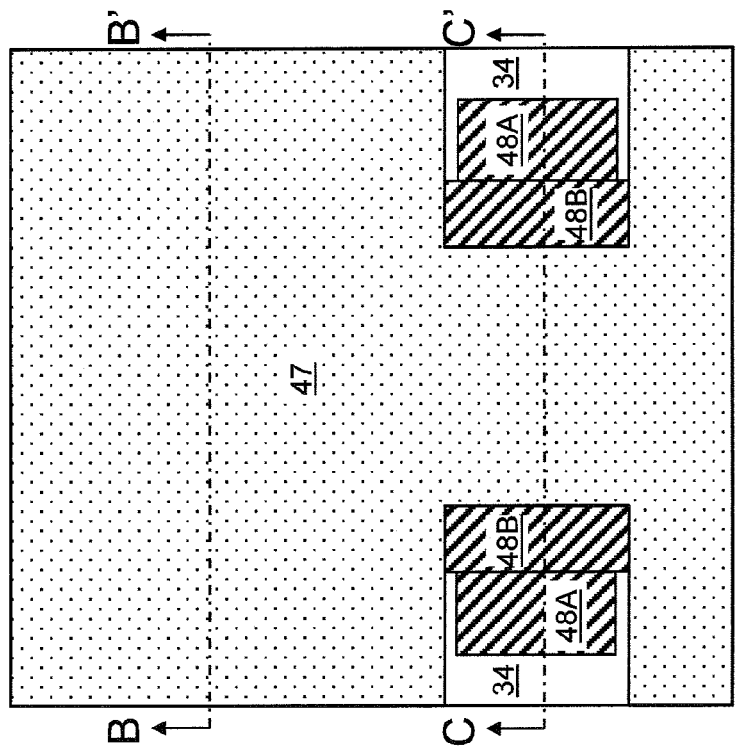

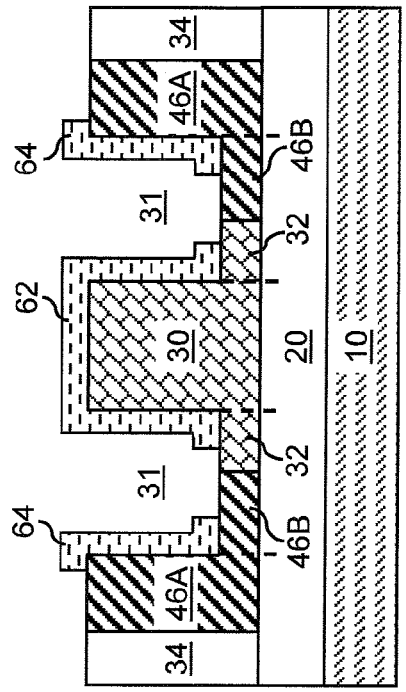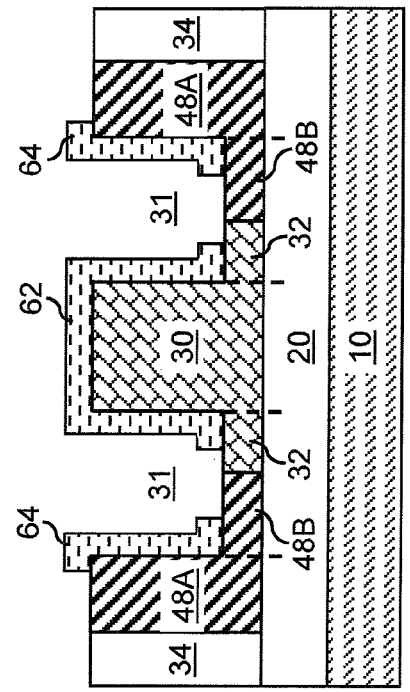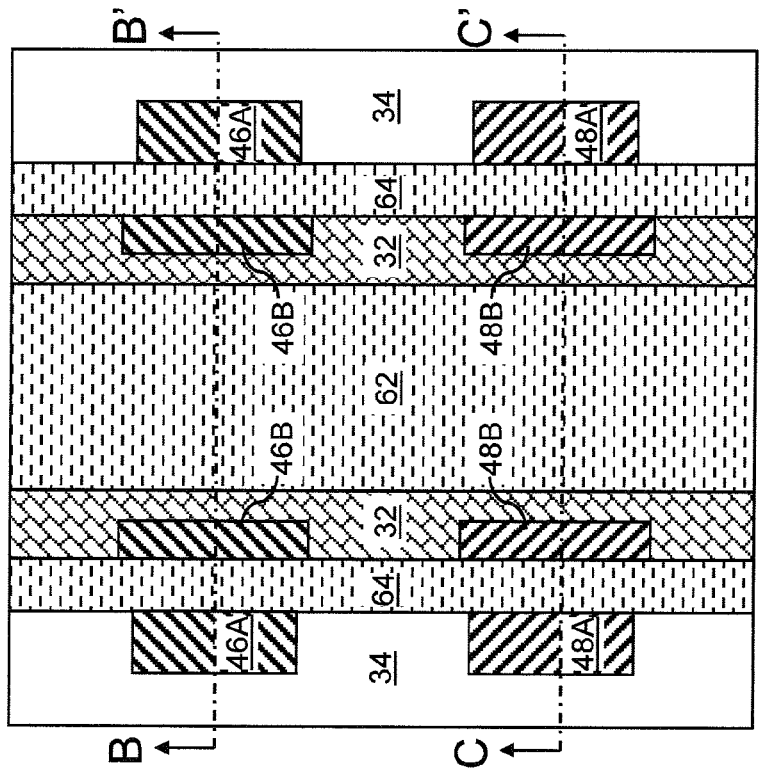

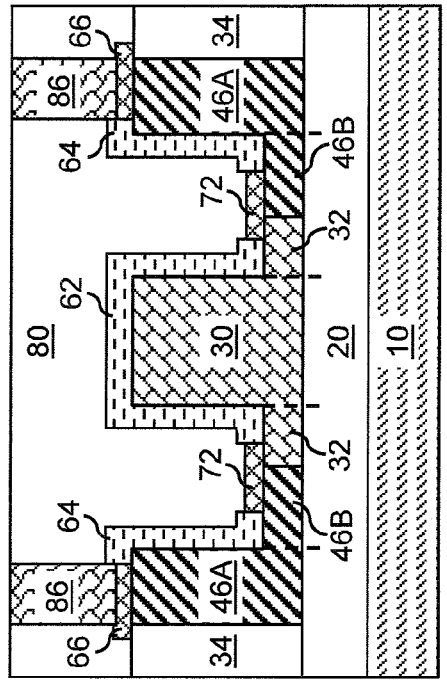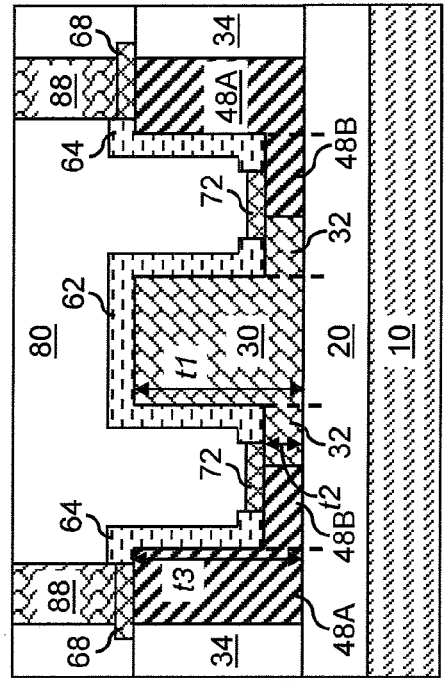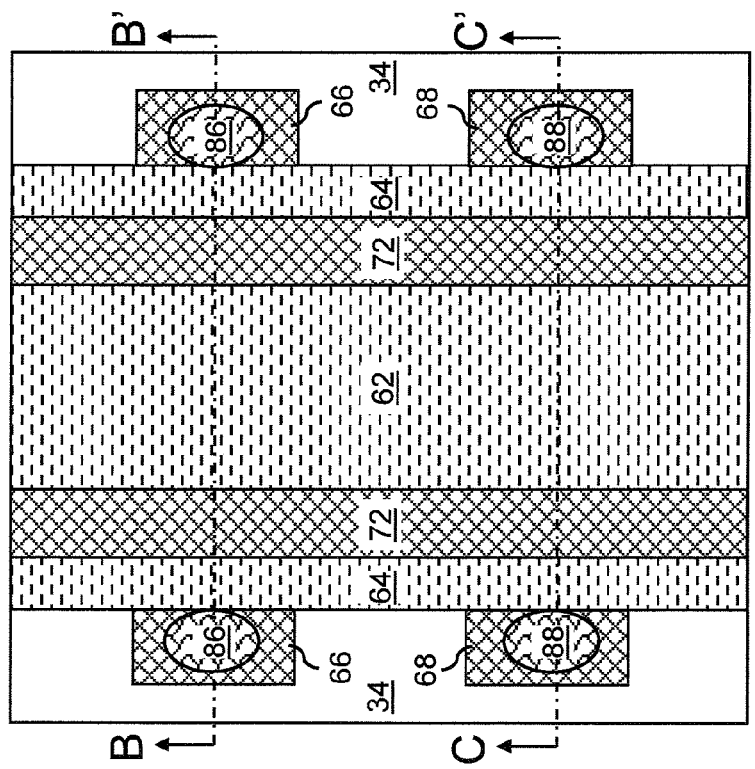

TEMPERATURE CONTROL DEVICE FOR OPTOELECTRONIC DEVICES

CROSS REFERENCE TO RELATED APPLICATION

This application is a divisional of U.S. patent application Ser. No. 13/363,995, filed Feb. 1, 2012, which is a divisional of U.S. patent application Ser. No. 12/498,463, filed Jul. 7, 2009, now U.S. Pat. No. 8,111,724, the entire contents and disclosures of which is incorporated herein by reference.

BACKGROUND

The present invention relates to a semiconductor structure, and particularly to a temperature control device for an optoelectronic device and a germanium photodetector for silicon waveguide, and methods of manufacturing the same, and methods of operating the same.

A semiconductor waveguide may be employed in microphotonic devices to enable high efficiency long range transmission of light over distances in the micrometer range or in the millimeter range. The semiconductor waveguide typically employs a single crystalline semiconductor material to minimize signal loss due to absorption of light. The semiconductor material in the semiconductor waveguide has a relative high refractive index. For example, silicon and germanium have a refractive index of about 3.45 and about 4.0, respectively. A dielectric material having a lower refractive constant surrounds the semiconductor waveguide so that a total reflection condition is satisfied at the interface between the semiconductor waveguide and the dielectric material for light impinging on the interface at a glancing angle. The semiconductor wave guide may thus be employed to transmit light having a wavelength greater than the wavelength corresponding to the band gap of the semiconductor material. Typically, infrared lights are employed in the semiconductor waveguide.

Many microphotonic devices manipulate the light in the semiconductor waveguide in some way. For example, the light in the semiconductor waveguide may be absorbed, reflected, or induced to change the phase. Many of the prior art methods that accomplish such optical manipulation employ exotic materials or special processing steps that are not typically employed in standard complementary metal-oxide-semiconductor (CMOS) processing steps, thereby increasing the manufacturing cost and processing complexity.

In view of the above, there exists a need to provide a structure that manipulates the light in a semiconductor waveguide with standard CMOS processing steps, and methods of manufacturing the same. Particularly, there exists a need to provide a structure that modulates the phase of the light in the semiconductor waveguide with standard CMOS processing steps, and methods of manufacturing the same.

Further, performance of many optoelectronic devices is temperature sensitive. For example, performance of a semiconductor laser device is significantly affected by temperature variation. In a semiconductor chip integrating conventional semiconductor devices and optoelectronic devices, the performance of optoelectronic devices may be affected significantly due to the heat generated by conventional semiconductor devices and transferred to the optoelectronic devices. Thus, it is necessary to stabilize the temperature of the optoelectronic devices to provide stable operation of the optoelectronic devices within the semiconductor chip.

While placing optoelectronic devices at a location far away from the conventional semiconductor devices the thermal effect on the performance of the optoelectronic devices, such a design lowers the areal density of the conventional semiconductor devices or the optoelectronic devices. Thus, an integrated semiconductor chip including conventional semiconductor devices and optoelectronic devices at high density without adverse impact on the performance of the optoelectronic devices due to the thermal effects on the optoelectronic devices is desired.

BRIEF SUMMARY

The present invention provides a semiconductor waveguide having an integrated thermoelectric temperature control device to enable phase shifting of the light in the semiconductor waveguide and an optoelectronic device having an integrated thermoelectric temperature control device to control the temperature of the optoelectronic device.

In one embodiment of the present invention, a semiconductor waveguide is formed integrally with non-recessed semiconductor regions that are adjoined to the semiconductor waveguide through a recessed semiconductor portion having a lesser thickness than the semiconductor waveguide. One of the non-recessed semiconductor portions and an adjoining region of the recessed semiconductor portion are doped with p-type dopants to form a p-doped semiconductor region, and another of the non-recessed semiconductor portions and an adjoining region of the recesses semiconductor portion are doped with n-type dopants to form an n-doped semiconductor region. After forming a dielectric spacer that covers sidewalls of the p-doped semiconductor region and the n-doped semiconductor region, the recessed semiconductor portion is metallized to form a recessed metal semiconductor alloy portion. Current is passed through the n-doped semiconductor region, the recessed metal semiconductor alloy portion, and the p-doped semiconductor region. The diffusion of majority charge carriers in the doped semiconductor regions transfers heat from or into the semiconductor waveguide through Peltier-Seebeck effect. The temperature change in the semiconductor waveguide alters refractive index of the semiconductor waveguide, which may be employed to modulate the phase of the light passing through the semiconductor waveguide.

According to an aspect of the present invention, a semiconductor structure is provided, which comprises:

a semiconductor waveguide having a first thickness and located on a top surface of an insulator layer;

a recessed semiconductor region of integral construction with the semiconductor waveguide, having a second thickness that is less than the first thickness, located on the insulator layer, and including a substantially undoped recessed semiconductor region;

a p-doped semiconductor region laterally abutting the substantially undoped recessed semiconductor region;

an n-doped semiconductor region laterally abutting the substantially undoped recessed semiconductor region and not abutting the p-doped semiconductor region; and a recessed metal semiconductor alloy portion abutting the recessed semiconductor region, the p-doped semiconductor region, and the n-doped semiconductor region.

According to another aspect of the present invention, a method of forming a semiconductor structure is provided, which comprises:

forming shallow trench isolation structures laterally abutting a top semiconductor portion and vertically abutting a buried insulator layer in a top semiconductor layer of a semiconductor-on-insulator (SOI) substrate;

forming a semiconductor waveguide by patterning the top semiconductor portion;

forming a p-doped semiconductor region in the top semiconductor portion;

forming an n-doped semiconductor region not abutting the p-doped semiconductor region in the top semiconductor region; and forming a recessed metal semiconductor alloy portion directly on a recessed region of the top semiconductor portion, wherein the recessed metal semiconductor alloy portion is formed directly on the p-doped semiconductor region and the n-doped semiconductor region.

According to yet another aspect of the present invention, a method of operating a semiconductor device is provided, which comprises:

providing a semiconductor structure including:

a semiconductor waveguide located on a top surface of an insulator layer;

a p-doped semiconductor region thermally connected to the silicon waveguide;

an n-doped semiconductor region thermally connected to the silicon waveguide and not abutting the p-doped semiconductor region; and a recessed metal semiconductor alloy portion abutting the p-doped semiconductor region and the n-doped semiconductor region; and passing current through the n-doped semiconductor region, the recessed metal semiconductor alloy portion, and the p-doped semiconductor region.

In another embodiment of the present invention, an optoelectronic device is formed on a semiconductor substrate in proximity to a temperature control device. A semiconductor waveguide that is optically coupled to the optoelectronic device may be formed to enable transmission of optical signal through the semiconductor waveguide. The temperature control device is configured to include a metal semiconductor alloy region located in proximity to the optoelectronic device, a first semiconductor region having a p-type doping, and a second semiconductor region having an n-type doping. The metal semiconductor alloy region is thermally coupled with the optoelectronic device. Electrical current may be caused to flow through the first semiconductor region, the metal semiconductor alloy region, and the second semiconductor region to allow cooling of the metal semiconductor alloy region and the optoelectronic device through heat transfer. Conversely, the current may be caused to flow in the opposite direction to allow heating of the metal semiconductor alloy region and the optoelectronic device through heat transfer. The temperature of the optoelectronic device may thus be controlled to stabilize the performance of the optoelectronic device.

According to an aspect of the present invention, a semiconductor structure including a temperature control device and an optoelectronic device is provided. The temperature control device includes: a first metal semiconductor alloy region located on a substrate; a p-doped semiconductor portion abutting the first metal semiconductor alloy region and located on the substrate; an n-doped semiconductor portion abutting the first metal semiconductor alloy region located on the substrate; wherein the temperature control device is configured to pass current from the p-doped semiconductor portion, through the first metal semiconductor alloy region, and to the n-doped semiconductor portion or from the n-doped semiconductor portion, through the first metal semiconductor alloy region, and to the p-doped semiconductor portion. The optoelectronic device includes a device that comprises a semiconductor material, configured to manipulate electromagnetic radiation, and is thermally coupled to the temperature control device.

According to another aspect of the present invention, a method of forming a semiconductor structure including a temperature control device and an optoelectronic device is provided. The method includes: patterning a top semiconductor layer of a semiconductor-on-insulator substrate to form a p-doped semiconductor portion and an n-doped semiconductor portion; forming a first metal semiconductor alloy region directly on the p-doped semiconductor portion and the n-doped semiconductor portion, wherein the p-doped semiconductor portion and an n-doped semiconductor portion and the first metal semiconductor alloy region constitute a portion of a temperature control device; forming a current conduction path configured to pass current from the p-doped semiconductor portion, through the first metal semiconductor alloy region, and to the n-doped semiconductor portion or from the n-doped semiconductor portion, through the first metal semiconductor alloy region, and to the p-doped semiconductor portion; and forming an optoelectronic device comprising a semiconductor material, configured to manipulate electromagnetic radiation, and is thermally coupled to the temperature control device.

According to yet another aspect of the present invention, a method of operating a semiconductor structure comprising a temperature control device and an optoelectronic device is provided. The method includes: providing a temperature control device including a first metal semiconductor alloy region located on a substrate, a p-doped semiconductor portion abutting the first metal semiconductor alloy region and located on the substrate, and an n-doped semiconductor portion abutting the first metal semiconductor alloy region located on the substrate; providing an optoelectronic device including a device that comprises a semiconductor material, configured to manipulate electromagnetic radiation, and is thermally coupled to the temperature control device; and passing electrical current from the p-doped semiconductor portion, through the first metal semiconductor alloy region, and to the n-doped semiconductor portion or from the n-doped semiconductor portion, through the first metal semiconductor alloy region, and to the p-doped semiconductor portion, wherein heat is transferred in the direction of flow of majority charge carriers in the p-doped semiconductor portion and the n-doped semiconductor portion.

BRIEF DESCRIPTION OF THE SEVERAL VIEWS OF THE DRAWINGS

For all of the figures herein, the following conventions apply. Figures with the same numeric label correspond to the same stage of manufacturing for an exemplary semiconductor structure. Within FIGS. 1A-9C, figures with the suffix "A" are top-down views, and figures with the suffix "B" or "C" are horizontal cross-sectional views along the plane B-B' or the plane C-C', respectively, in the figure with the same numeric label and the suffix "A."

FIGS. 1A-1C are various views of a first exemplary semiconductor structure corresponding to the step after formation of a shallow trench isolation structures 34.

FIGS. 3A-3C are various views of the first exemplary semiconductor structure corresponding to the step after removal of a first photoresist (37A, 37B, 37C).

FIGS. 4A-4C are various views of the first exemplary semiconductor structure corresponding to the step after formation of p-doped semiconductor regions (46A, 46B).

FIGS. 5A-5C are various views of the first exemplary semiconductor structure corresponding to the step after formation of n-doped semiconductor regions (48A, 48B).

FIGS. 8A-8C are various views of the first exemplary semiconductor structure corresponding to the step after formation of a dielectric material portion 62 and dielectric spacers 64.

FIGS. 9A-9C are various views of the first exemplary semiconductor structure corresponding to the step after formation of various metal semiconductor alloy portions, a middle-of-line (MOL) dielectric layer 80, and various conductive contact vias.

FIGS. 10 and 11 are vertical cross-sectional views. Each of FIGS. 12A, 13A, 13A, 14A, 15A, and 16A is a vertical cross-sectional view along a vertical plane labeled Z-Z' in figures with the numeric label and the suffix "B. " FIGS. 11B, 12B, 13B, and 14B are top-down views. FIG. 15B is a top-down view of selected elements to demonstrate lateral geometrical relationship between the selected elements.

DETAILED DESCRIPTION

Figure 2B:
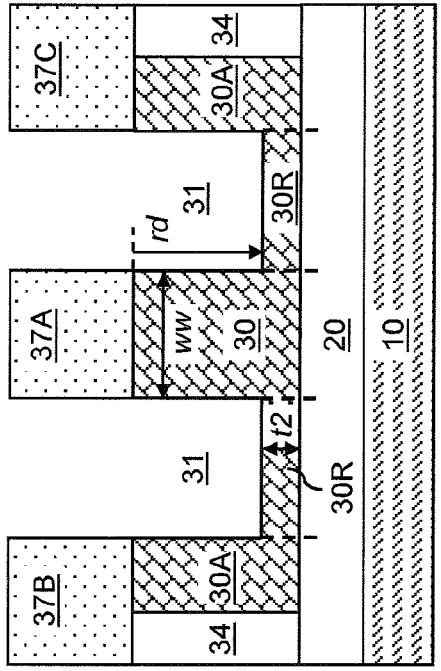
FIGS. 2A-2C are various views of the first exemplary semiconductor structure corresponding to the step after formation of a pair of recessed line trenches 31.

As stated above, the present invention relates to a temperature control device for an optoelectronic device and a germanium photodetector for silicon waveguide, and methods of manufacturing the same, and methods of operating the same, which are now described in detail with accompanying figures. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIGS. 1A-1F, an exemplary semiconductor structure according to the present invention comprises a semiconductor substrate, which is a semiconductor-on-insulator (SOI) substrate. The semiconductor substrate includes an insulator layer 20 and a top semiconductor layer located above the insulator layer 20. The semiconductor substrate may further include a handle substrate 10, which is attached to the bottom surface of the insulator layer 20. The handle substrate 10 may comprise a semiconductor material, an insulator material, a conductive material, or a combination thereof. The insulator layer 20 and the handle substrate 10, if present, provide structural support to the top semiconductor layer which may comprise a contiguous semiconductor material layer that covers the entirety of the insulator layer 20.

The contiguous semiconductor material layer comprises a semiconductor material. Exemplary semiconductor materials that may be employed for the contiguous semiconductor material layer include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the entirety of the contiguous semiconductor material layer comprises a single crystalline semiconductor material having an epitaxial alignment among the semiconductor atoms. For example, the semiconductor material of the contiguous semiconductor material layer may comprise single crystalline silicon or single crystalline germanium. The thickness of the contiguous semiconductor material layer, which is herein referred to as a first thickness t1, may be from about 50 nm to about 1,000 nm, and typically from about 200 nm to about 500 nm, although lesser and greater thicknesses can also be employed.

Preferably, the contiguous semiconductor material layer comprises a substantially undoped semiconductor material so that the amount of impurities, including dopant atoms, in the contiguous semiconductor material layer is minimized. By minimizing the amount of impurities in the contiguous material layer, a semiconductor waveguide to be subsequently formed from a portion of the contiguous material layer provides low absorption rate of the signal. The atomic concentration of impurities, including dopants, in the contiguous semiconductor material layer is less than about $1.0 \times 10^{16}/cm^3$, and preferably less than about $1.0 \times 10^{15}/cm^3$, and more preferably less than about $1.0 \times 10^{14}/cm^3$. In case the contiguous semiconductor material layer comprises silicon, the resistivity of the material of the contiguous semiconductor material layer is greater than about 1 Ohm-cm, and preferably greater than about 10 Ohm-cm, and more preferably greater than about 100 Ohm-cm.

Trenches extending to the top surface of the insulator layer 20 are formed within the contiguous semiconductor material layer by a combination of lithographic means and an etch. Specifically, a photoresist (not shown) is applied over the top surface of the contiguous semiconductor material layer and lithographically patterned. The pattern in the photoresist is transferred into the contiguous semiconductor material layer by the etch, which is typically an anisotropic etch. After removal of the photoresist, the trenches are filled with a dielectric material such as a dielectric oxide, a dielectric nitride, a dielectric nitride, or a combination thereof. For example, silicon oxide and/or silicon nitride may be deposited into the trenches. The dielectric material above the top surface of the contiguous semiconductor material layer is removed, for example, by chemical mechanical planarization. The remaining portions of the dielectric material filling the trenches constitute shallow trench isolation (STI) structures 34. Pad dielectric layers (not shown) may be employed to facilitate the planarization process.

The remaining portion of the contiguous semiconductor material layer constitutes a top semiconductor portion, which includes a primary top semiconductor portion 30P, first laterally protruding top semiconductor portions 30A, and second laterally protruding top semiconductor portions 30B. The primary top semiconductor portion 30P, the first laterally protruding top semiconductor portions 30A, and the second laterally protruding top semiconductor portions 30B comprise the same semiconductor material, have the same thickness, i.e., the first thickness t1, and are epitaxially aligned among one another. The sidewalls of the top semiconductor portion (30P, 30A, 30B) are laterally abutted by the shallow trench isolation structures 34. The first laterally protruding top semiconductor portions 30A and the second laterally protruding top semiconductor portions 30B laterally protrude out of the sidewalls of the primary top semiconductor portion 30P into the shallow trench isolation structures 34. Thus, each of the first laterally protruding top semiconductor portions 30A and the second laterally protruding top semiconductor portions 30B may comprise multiple sidewalls that laterally abut the shallow trench isolation structures 34. The shallow trench isolation structures 34 and the top semiconductor portion (30P, 30A, 30B) have substantially the same thickness, i.e., the first thickness t1.

At least one pair of a first laterally protruding top semiconductor portions 30A and a second laterally protruding top semiconductor portions 30B may be formed on one side of the primary top semiconductor portion 30P, and at least another pair of a first laterally protruding top semiconductor portions 30A and a second laterally protruding top semiconductor portions 30B may be formed on an opposite side of the primary top semiconductor portion 30P. The width of the semiconductor portion SPW may be from about 400 nm to about 3,000 nm, and preferably from about 600 nm to about 1,500 nm, although lesser and greater widths can also be employed. The length of the semiconductor portion SPL is the length of a semiconductor waveguide that is intended to be manufactured, and may be from about 10 μm to about 3 cm, and typically from about 30 μm to about 1 cm, although lesser and greater lengths can also be employed. Further, configurations for a semiconductor waveguide having a curvature or a taper can also be employed, in which the shape of the top semiconductor portion (30P, 30A, 30B) are adjusted with a curvature, a taper, and/or other suitable geometric adjustments.

Figure 2C:
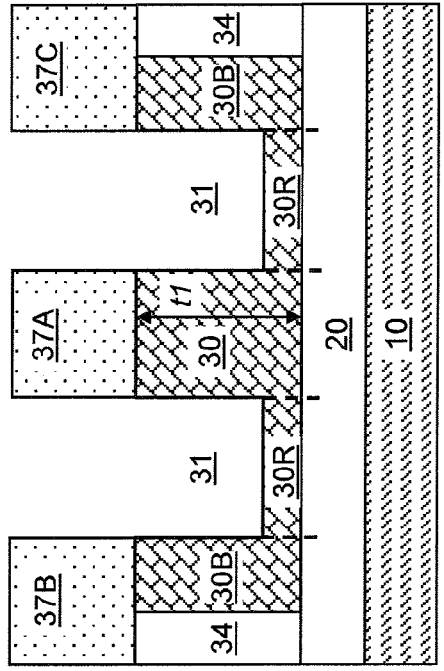
Figure 2A:
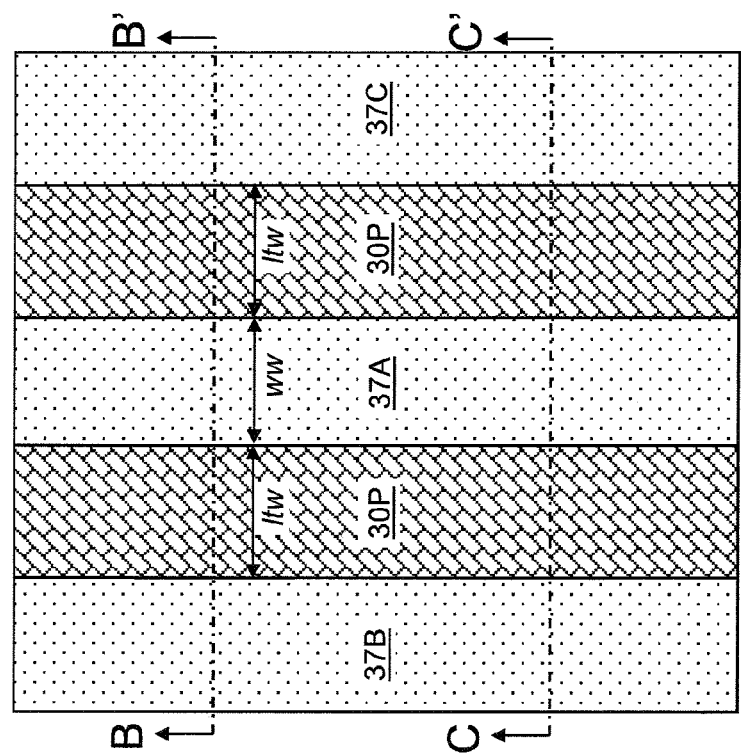

Referring to FIGS. 2A-2C, a first photoresist is applied over the top surfaces of the top semiconductor portion (30P, 30A, 30B) and the shallow trench isolation structures 34 and lithographically patterned. The pattern in the first photoresist includes a pair of line troughs separated by a central photoresist portion 37A, which is a remaining portion of the first photoresist after lithographic patterning. The central photoresist portion 37A has a constant width, which is herein referred to as a waveguide width ww. The waveguide width ww may be from about 200 nm to about 1,500 nm, and preferably from about 300 nm to about 750 nm, although lesser and greater widths can also be employed. The remaining portions of the first photoresist include a first-side photoresist portion 37B and a second-side photoresist portion 37C, which are separated from the central photoresist portion 37A by the pair of line troughs. Each of the line troughs may have a substantially constant width, which is herein referred to as a line trough width ltw. The two line troughs may have the same line trough width ltw, or may have different line trough widths ltw. The sum of the two line trough widths ltw and the waveguide width ww may be less than, equal to, or greater than the width of the semiconductor portion SPW. While the present invention is described for the case in which the sum of the two line trough widths ltw and the waveguide width ww is less than the width of the semiconductor portion SPW, embodiments in which the sum of the two line trough widths ltw and the waveguide width ww is equal to, or greater than, the width of the semiconductor portion SPW are explicitly contemplated herein.

The pattern in the patterned portions of the first photoresist, i.e., the set of the central photoresist portion 37A, the first-side photoresist portion 37B, and the second-side photoresist portion 37C is transferred into the primary top semiconductor portion 30P, for example, by an anisotropic etch such as a reactive ion etch (RIE). The exposed portions of the primary top semiconductor portion 30P are vertically recessed by a recess depth rd, which is less than the first thickness t1. A pair of recessed line trenches 31 is formed directly underneath the two line troughs between the central photoresist portion 37A and each of the first-side and second-side photoresist portions (37B, 37C).

The recessed portions of the primary top semiconductor portion 30P are herein referred to as recessed semiconductor regions 30R. The recessed semiconductor regions have a second thickness t2, which is equal to the difference between the first thickness t1 and the recess depth rd. The second thickness t2 may be from about 10 nm to about 200 nm, and typically from about 30 nm to about 100 nm, although lesser and greater thicknesses can also be employed. The remaining sub-portion of the primary top semiconductor portion 30P underneath the central photoresist portion 37A is herein referred to a semiconductor waveguide 30. The semiconductor waveguide 30 has the first thickness t1 and the waveguide width ww. The semiconductor waveguide 30 may be employed to transmit light along the direction of the length of the semiconductor portion SPL (See FIG. 1A). The sub-portions of the top semiconductor portion 30P directly underneath the pair of line trenches 31 are the recessed semiconductor regions 30R, which are of integral construction with the semiconductor waveguide 30.

The first-side photoresist portion 37B and the second-side photoresist portion 37C cover the upper surfaces of the first laterally protruding top semiconductor portions 30A and the second laterally protruding top semiconductor portions 30B. Thus, the first-side photoresist portion 37B and the second-side photoresist portion 37C are not recessed by the anisotropic etch, and have the first thickness t1. Each of the first laterally protruding top semiconductor portions 30A and the second laterally protruding top semiconductor portions 30B is a sup-portion of the top semiconductor portion (30P, 30A, 30b) having the first thickness t1. Sidewalls of the first laterally protruding top semiconductor portions 30A and the second laterally protruding top semiconductor portions 30B are exposed to the pair of recessed line trenches 31.

The semiconductor waveguide 30, the recessed semiconductor regions 30R, the first-side photoresist portions 37B, and the second-side photoresist portions 37C are of integral and unitary construction, i.e., in a single contiguous structure without any interface therebetween. In case the entirety of the top semiconductor portion (30P, 30A, 30B) is single crystalline prior to the formation of the semiconductor waveguide 30, the semiconductor waveguide 30, the recessed semiconductor regions 30R, the first-side photoresist portions 37B, and the second-side photoresist portions 37C are single crystalline and epitaxially aligned among one another. In case the semiconductor substrate is an SOI substrate, the semiconductor waveguide 30, the semiconductor waveguide 30, the recessed semiconductor regions 30R, the first-side photoresist portion 37B, the second-side photoresist portion 37C, and the shallow trench isolation structures 34 are formed in a top semiconductor layer of the SOI substrate.

Referring to FIGS. 3A-3F, the first photoresist is removed selective to the semiconductor material of the semiconductor waveguide 30, the recessed semiconductor regions 30R, the first-side photoresist portion 37B, the second-side photoresist portion 37C. Preferably, the removal of the first photoresist is selective to the dielectric material of the shallow trench isolation structures 34. While the present invention is described for the case in which edges of the recessed line trenches 31 is coincident with the sidewalls of the shallow trench isolation structures 34 that laterally abut the primary top semiconductor portion 30P (See FIG. 1A), embodiments in which the edges of the recessed line trenches 31 is offset from the sidewalls of the shallow trench isolation structures 34 inward or outward are explicitly contemplated herein.

Referring to FIGS. 4A-4C, a second photoresist 45 is applied over the first exemplary semiconductor structure and lithographically patterned to form openings. The first laterally protruding top semiconductor portions 30A are exposed within the openings. Further, portions of the recessed semiconductor regions 30R that adjoin the first laterally protruding top semiconductor portions 30A are also exposed within the opening in the second photoresist 45. The second photoresist 45 covers the entirety of the semiconductor waveguide 30 and the second laterally protruding top semiconductor portions 30B. Further, the second photoresist 45 covers portions of the recessed semiconductor regions 30R that laterally abut the semiconductor waveguide 30.

P-type dopants are implanted into the first laterally protruding top semiconductor portions 30A and the exposed portions of the recessed semiconductor regions 30R. P-type dopants may be boron, gallium, indium, or a combination thereof. Preferably, the dose and the energy of the p-type dopants are selected to provide a heavy doping in the implanted regions. For example, the atomic concentration of p-type dopants in the implanted regions may be from about $1.0 \times 10^{19}/cm^3$ to about $1.0 \times 10^{21}/cm^3$, and typically from about $5.0 \times 10^{19}/cm^3$ to about $5.0 \times 10^{20}/cm^3$, although lesser and greater dopant concentrations can also be employed.

The first laterally protruding top semiconductor portions 30A as implanted with the p-type dopants are herein referred to as p-doped non-recessed semiconductor regions 46A, which has a third thickness t3. Typically, the third thickness t3 is the same as the first thickness t1. The portions of the recessed semiconductor regions 30R that are implanted with the p-type dopants are herein referred to as p-doped recessed semiconductor regions 46B. A contiguous pair of a p-doped non-recessed semiconductor region 46A and a p-doped recessed semiconductor region 46B collectively constitutes a p-doped semiconductor region (46A, 46B). The portions of the recessed semiconductor regions 30R that are not implanted with the p-type dopants are herein referred to as substantially undoped recessed semiconductor regions 32, which has the same composition as the semiconductor waveguide 30, i.e., has a total concentration of impurities, including dopants, less than about $1.0 \times 10^{16}/cm^3$.

Within each p-doped semiconductor region (46A, 46B), a p-doped non-recessed semiconductor region 46A laterally abuts a p-doped recessed semiconductor region 46B. Further, each p-doped recessed semiconductor region 46B laterally abuts a substantially undoped recessed semiconductor region 32. The second photoresist 45 is subsequently removed.

Referring to FIGS. 5A-5C, a third photoresist 47 is applied over the first exemplary semiconductor structure and lithographically patterned to form openings. The second laterally protruding top semiconductor portions 30B are exposed within the openings. Further, portions of the substantially undoped recessed semiconductor regions 32 that adjoin the second laterally protruding top semiconductor portions 30B are also exposed within the opening in the third photoresist 47. The third photoresist 47 covers the entirety of the semiconductor waveguide 30 and the p-doped semiconductor region (46A, 46B). Further, the third photoresist 47 covers portions of the substantially undoped recessed semiconductor regions 32 that laterally abut the semiconductor waveguide 30.

N-type dopants are implanted into the second laterally protruding top semiconductor portions 30B and the exposed portions of the substantially undoped recessed semiconductor regions 32. N-type dopants may be phosphorus, arsenic, antimony, or a combination thereof. Preferably, the dose and the energy of the n-type dopants are selected to provide a heavy doping in the implanted regions. For example, the atomic concentration of n-type dopants in the implanted regions may be from about $1.0 \times 10^{19}/cm^3$ to about $1.0 \times 10^{21}/cm^3$, and typically from about $5.0 \times 10^{19}/cm^3$ to about $5.0 \times 10^{20}/cm^3$, although lesser and greater dopant concentrations can also be employed.

The second laterally protruding top semiconductor portions 30B as implanted with the n-type dopants are herein referred to as n-doped non-recessed semiconductor regions 48A, which has the third thickness t3. The portions of the substantially undoped recessed semiconductor regions 32 that are implanted with the n-type dopants are herein referred to as n-doped recessed semiconductor regions 48B. A contiguous pair of an n-doped non-recessed semiconductor region 48A and an n-doped recessed semiconductor region 48B collectively constitutes an n-doped semiconductor region (48A, 48B). The substantially undoped recessed semiconductor regions 32 is reduced as portions of the substantially undoped recessed semiconductor regions 32 are converted into the n-doped recessed semiconductor regions 48B.

Within each n-doped semiconductor region (48A, 48B), an n-doped non-recessed semiconductor region 48A laterally abuts an n-doped recessed semiconductor region 48B. Further, each n-doped recessed semiconductor region 48B laterally abuts a substantially undoped recessed semiconductor region 32. The third photoresist 47 is subsequently removed.

Figure 6B:
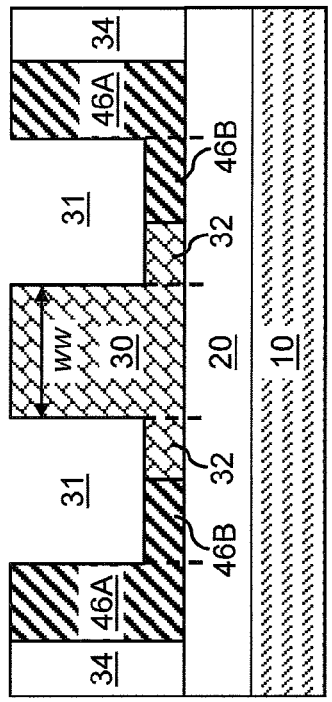
FIGS. 6A-6C are various views of the first exemplary semiconductor structure corresponding to the step after removal of a third photoresist 47.
Figure 6C:
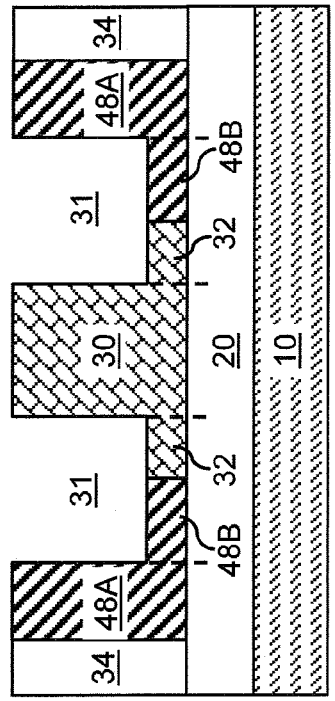
Figure 6A:
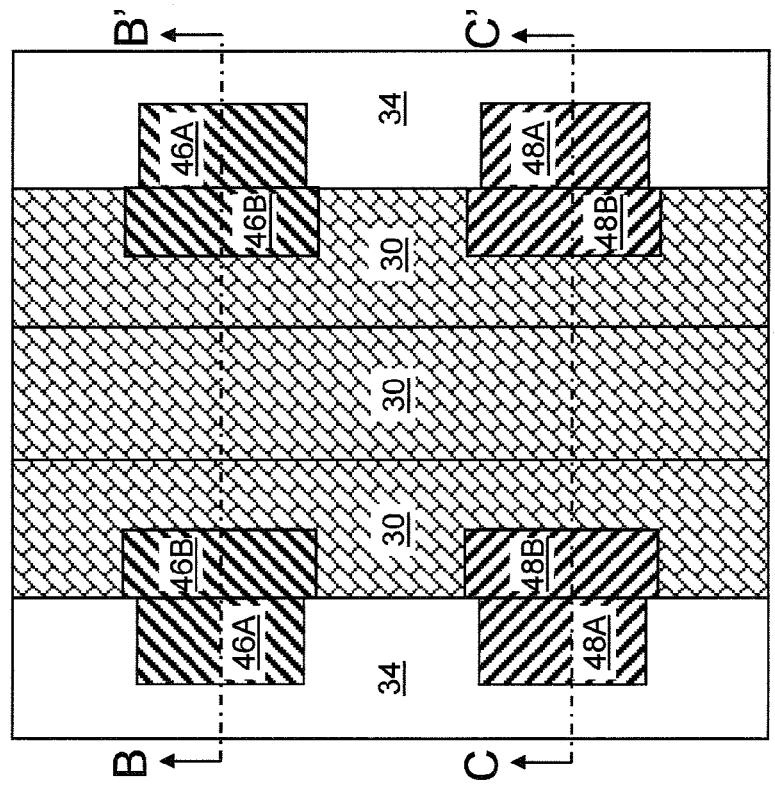

Referring to FIGS. 6A-6C, the first exemplary semiconductor structure after removal of the third photoresist 47 is shown. The substantially undoped recessed semiconductor regions 32, the p-doped recessed semiconductor regions 46B, and the n-doped recessed semiconductor regions 48B collectively constitute the recessed semiconductor regions (32, 46B, 48B). The recessed semiconductor regions (32, 46B, 48B) underlie the pair of recessed line trenches 31. The p-doped non-recessed semiconductor regions 48A, the n-doped non-recessed semiconductor regions 48A, and the semiconductor waveguide 30 are not recessed. Each of the p-doped non-recessed semiconductor regions 48A and the n-doped non-recessed semiconductor regions 48A has a sidewall that is exposed to one of the recessed line trenches 31. The semiconductor waveguide 30 has two substantially parallel and substantially vertical sidewalls separated by the waveguide width ww. Each sidewall of the semiconductor waveguide 30 is exposed to one of the two recessed line trenches 31.

Figure 7B:
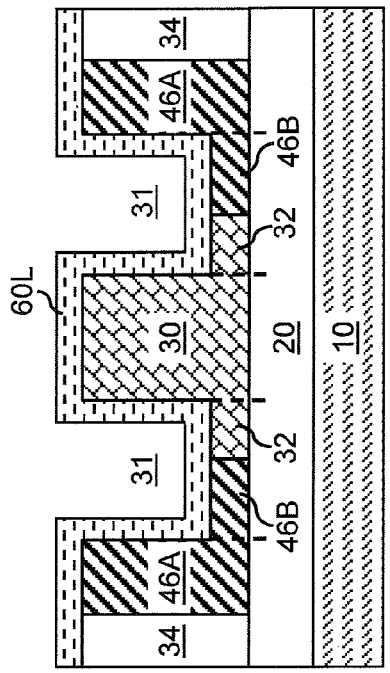
FIGS. 7A-7C are various views of the first exemplary semiconductor structure corresponding to the step after formation of a dielectric material layer 60L.
Figure 7C:
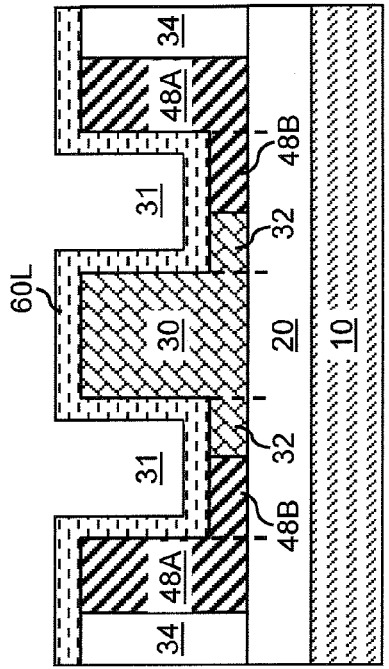
Figure 7A:
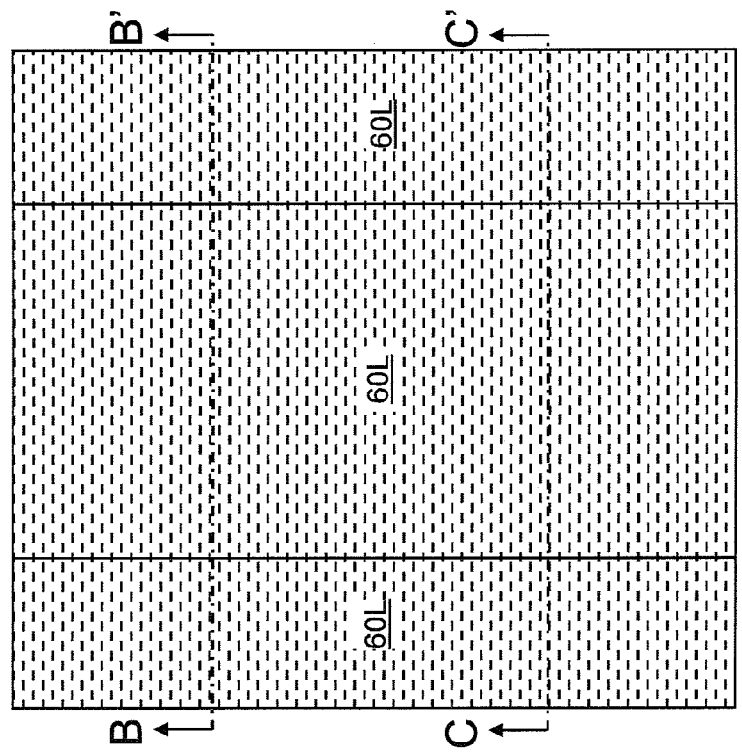

Referring to FIGS. 7A-7C, a dielectric layer 60L is formed directly on the exposed surfaces of the first exemplary semiconductor structure including the top surface and the sidewall surfaces of the semiconductor waveguide 30, the top surfaces of the recessed semiconductor regions (32, 46B, 48B), the top surfaces and the sidewalls of the p-doped non-recessed semiconductor region 46A and the n-doped non-recessed semiconductor region 48A, and the top surfaces of the shallow trench isolation structures 34. The dielectric layer 60L comprises a dielectric material such as a dielectric oxide, a dielectric nitride, a dielectric oxynitride, or a combination thereof. For example, the dielectric layer 60L may comprise silicon nitride or silicon oxide. The dielectric material for the dielectric layer 60L has a lower refractive index than the semiconductor material of the semiconductor waveguide 30.

The dielectric layer 60L may be conformal or non-conformal. The thickness of the dielectric layer 60L, as measured on the top surface of the semiconductor waveguide 30, may be from about 4 nm to about 100 nm, and typically from about 10 nm to about 50 nm, although lesser and greater thicknesses can also be employed. The dielectric layer 60L may be formed by low pressure chemical vapor deposition (LPCVD), plasma enhanced chemical vapor deposition (PECVD), rapid thermal chemical vapor deposition (RTCVD), atomic layer deposition (ALD), etc.

Referring to FIGS. 8A-8C, the dielectric layer 60L is lithographically patterned into at least three portions. The lithographic patterning may be effected by applying a photoresist (not shown) to the top surface of the dielectric layer 60L and lithographically patterning the photoresist, followed by a pattern transfer into the dielectric layer by an etch. The etch may be an anisotropic etch or an isotropic etch.

Remaining portions of the dielectric layer 60L after the lithographic patterning include a dielectric material portion 62 which covers the entirety of the top surface and sidewalls of the semiconductor waveguide 30. The remaining portions of the dielectric layer 60L further includes dielectric spacers 64, each of which is located directly on at least one of a sidewall of a p-doped non-recessed semiconductor region 46A and a sidewall of an n-doped non-recessed semiconductor region 48A. In one embodiment, a dielectric spacer 64 may be formed contiguously and directly on a sidewall of a p-doped non-recessed semiconductor region 46A, a sidewall of an n-doped non-recessed semiconductor region 48A, and a sidewall of one of the shallow trench isolation structures 34 that is located between the p-doped non-recessed semiconductor region 46A and the sidewall of an n-doped non-recessed semiconductor region 48A. Horizontal surfaces of the p-doped non-recessed semiconductor regions 46A, the n-doped non-recessed semiconductor regions 48A, the p-doped recessed semiconductor regions 46B, and the n-doped recessed semiconductor regions 48B are exposed. All sidewalls of the p-doped non-recessed semiconductor regions 46A and the n-doped non-recessed semiconductor regions 48A are covered by the dielectric spacers 64.

On each side of the semiconductor waveguide 30, a contiguous set of exposed semiconductor surfaces is formed, which includes a top surface of a p-doped recessed semiconductor regions 46B, a top surface of an n-doped recessed semiconductor regions 48B, and a top surface of a portion of a substantially undoped recessed semiconductor regions 32 located therebetween.

Referring to FIGS. 9A-9C, various metal semiconductor alloy portions are formed on the exposed semiconductor surfaces of the first exemplary semiconductor structure. Specifically, recessed metal semiconductor alloy portions 72 are formed directly on the exposed surfaces of the recessed semiconductor regions (32, 46B, 48B). First metal semiconductor alloy portions 66 are formed directly on the top surfaces of the p-doped non-recessed semiconductor regions 46A. Second metal semiconductor alloy portions 68 are formed directly on the top surfaces of the n-doped non-recessed semiconductor regions 46B.

The various metal semiconductor alloy portions (72, 66, 68) may be formed by methods known in the art such as deposition of a blanket metal layer, anneal at an elevated temperature to induce formation of metal semiconductor alloy materials, and removal of unreacted portions of the blanket metal layer. In case the semiconductor material of the recessed semiconductor regions (32, 46B, 48B) and the doped non-recessed semiconductor regions (46A, 48A) comprise silicon, the various metal semiconductor alloy portions (72, 66, 68) comprise a metal silicide. In case the semiconductor material of the recessed semiconductor regions (32, 46B, 48B) and the doped non-recessed semiconductor regions (46A, 48A) comprise germanium, the various metal semiconductor alloy portions (72, 66, 68) comprise a metal germanide. The recessed metal semiconductor alloy portions 72, the first metal semiconductor alloy portions 66, and the second metal semiconductor alloy portions 68 comprise the same metal semiconductor alloy material.

A middle-of-line (MOL) dielectric material layer 80 is formed on the first exemplary semiconductor structure. The pair of line troughs 31 is filled with the MOL dielectric layer 80. The dielectric materials that may be used for the MOL dielectric layer 80 include, but are not limited to, a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may non-porous or porous.

A conductive contact via is formed directly on each of the first metal semiconductor alloy portions 66 and the second metal semiconductor alloy portions 68. Specifically, a first conductive contact via 86 is formed directly on each of the first metal semiconductor alloy portion 66, and a second conductive contact via 88 is formed directly on each of the second metal semiconductor alloy portion 68. The first and second metal semiconductor alloy portions (66, 68) comprise a conductive material such as doped polysilicon, a doped silicon-containing semiconductor material, W, Cu, Al, TaN, TiN, Ta, Ti, or a combination thereof.

Heat may be transferred between the semiconductor waveguide 30 and the set of the first metal semiconductor alloy portions 66 and the second metal semiconductor alloy portions 68 by passing current. Specifically, a voltage bias may be applied across a resistively connected pair of a first conducive contact via 86 and a second conductive contact via 88.

In one embodiment, the second conductive contact via 88 is held at a positive voltage relative to the first conductive contact via 86. In this case, electrical current flows from the second conductive contact via 88, then through a second metal semiconductor alloy portion 68, then through an n-doped non-recessed semiconductor region 48A, then through an n-doped recessed semiconductor region 48B, then through a recessed metal semiconductor alloy portion 72, then through a p-doped recessed semiconductor region 46B, then through a p-doped non-recessed semiconductor region 46A, then through a first metal semiconductor alloy portion 66, and into the first conductive contact via 86. In metallic materials or metal semiconductor alloy portions in the current path, electrons move in the opposite direction of the current flow to conduct electricity.

In semiconductor material portions, majority charge carriers provide electrical conduction. Specifically, holes having positive charges travel in the p-doped recessed semiconductor region 46B and the p-doped non-recessed semiconductor region 46A along the direction from the recessed metal semiconductor alloy portion 72 toward the first metal semiconductor alloy portion 66. Electrons having negative charges travel in the n-doped recessed semiconductor region 48B and the n-doped non-recessed semiconductor region 48A along the direction from the recessed metal semiconductor alloy portion 72 toward the second metal semiconductor alloy portion 68. Thus, the majority charge carriers travel away from the recessed metal semiconductor alloy portion 72 in the p-doped semiconductor region (46A, 46B) and the n-doped semiconductor region (48A, 48B).

The mechanism of Peltier-Seebeck effect is in operation in the p-doped semiconductor region (46A, 46B) and the n-doped semiconductor region (48A, 48B). According to Peltier-Seebeck effect, heat transfer accompanies diffusion of charge carriers in a semiconductor material and vice versa. In this case, the majority charge carriers diffuse away from the interface with the recessed metal semiconductor alloy portion 72 toward the interface with the first or second metal semiconductor alloy portion (66 or 68) in each of the p-doped semiconductor region (46A, 46B) and the n-doped semiconductor region (48A, 48B). Therefore, there is a net heat transfer from the recessed metal semiconductor alloy portion 72 to the first and second metal semiconductor alloy portions (66, 68). The heat that is transferred to the first and second metal semiconductor alloy portions (66, 68) may further be transferred to a heat sink through the first and second conductive contact vias (86, 88) and other metal interconnect structures (not shown) attached thereto.

Since the semiconductor waveguide 30, the recessed semiconductor regions (32, 46B, 48B), the p-doped semiconductor region (46A, 46B), and the n-doped semiconductor region (48A, 48B) are of integral construction without any interface therebetween, the entirety of the semiconductor waveguide 30, the recessed semiconductor regions (32, 46B, 48B), the p-doped semiconductor region (46A, 46B), and the n-doped semiconductor region (48A, 48B) is thermally connected among one another. Continual transfer of heat from the recessed metal semiconductor alloy portions 72, through the p-doped semiconductor region (46A, 46B) and the n-doped semiconductor region (48A, 48B), and into the first and second metal semiconductor alloy portions (66, 68) cools the semiconductor waveguide 30.

Cooling of the semiconductor waveguide 30 affects the refractive index of the semiconductor material of the semiconductor waveguide. For example, single crystalline silicon has a wavelength-dependent refractive index, which is from about 3.42 to about 3.56 between the wavelength range from about 1 micron to about 6 microns. The temperature dependency of the refractive index of silicon is about $1.6 \times 10^{-4}$ per degree Celsius. Germanium has similar temperature dependency as silicon.

Temperature change in the semiconductor waveguide 30 may be advantageously employed to change the phase of light passing through the semiconductor waveguide. For example, light having a wavelength of about 3.42 micron in vacuum has a wavelength of about 1.00 micron in a semiconductor waveguide 30 that consists essentially of silicon. 1 degree change in the temperature of the semiconductor waveguide 30 induces a phase change of about $2\pi \times 1.6 \times 10^{-4}$ radian per 1 micron. The light changes phase by $\pi$ radian after traveling about 3.125 mm. By employing a beam splitter connected to two semiconductor waveguides 30 and modulating the phase of the light in one of the semiconductor waveguides 30, constructive interference or destructive interference may be induced between the two beams as the phase of one beam is modulated through cooling. Thus, by modulating the refractive index of a semiconductor waveguide 30 through the temperature change in the semiconductor waveguide 30 caused by heat transfer out of the semiconductor waveguide 30, the phase of the light passing through the semiconductor waveguide 30 may be modulated.

In another embodiment, the second conductive contact via 88 is held at a negative voltage relative to the first conductive contact via 86. In this case, electrical current flows from the first conductive contact via 86, then through a first metal semiconductor alloy portion 66, then through a p-doped non-recessed semiconductor region 46A, then through a p-doped recessed semiconductor region 46B, then through a recessed metal semiconductor alloy portion 72, then through an n-doped recessed semiconductor region 48B, then through an n-doped non-recessed semiconductor region 48A, then through a second metal semiconductor alloy portion 68, and into the second conductive contact via 88. In other words, the electrical current flows in the opposite direction of the current flow in the previous embodiment.

In this case, holes in the p-doped semiconductor region (46A, 46B) along the direction from the first metal semiconductor alloy portion 66 to the recessed metal semiconductor alloy portion 72. Electrons travel in the n-doped semiconductor region (48A, 48B) along the direction from the second metal semiconductor alloy portion 68 toward the recessed metal semiconductor alloy portion 72. Thus, the majority charge carriers travel toward the recessed metal semiconductor alloy portion 72 in the p-doped semiconductor region (46A, 46B) and the n-doped semiconductor region (48A, 48B).

The mechanism of Peltier-Seebeck effect is also in operation in the p-doped semiconductor region (46A, 46B) and the n-doped semiconductor region (48A, 48B). However, the majority charge carriers diffuse away from the interface with the first or second metal semiconductor alloy portion (66 or 68) toward the interface with the recessed metal semiconductor alloy portion 72 in each of the p-doped semiconductor region (46A, 46B) and the n-doped semiconductor region (48A, 48B). Therefore, there is a net heat transfer from the first and second metal semiconductor alloy portions (66, 68) to the recessed metal semiconductor alloy portion 72.

Since the entirety of the semiconductor waveguide 30, the recessed semiconductor regions (32, 46B, 48B), the p-doped semiconductor region (46A, 46B), and the n-doped semiconductor region (48A, 48B) is thermally connected among one another, heat transferred into the recessed metal semiconductor alloy portion 72 is transferred into the semiconductor waveguide 30. Thus, the semiconductor waveguide is heated as the current flows through the p-doped semiconductor region (46A, 46B) and the n-doped semiconductor region (48A, 48B). The mechanism for the heat accumulation in the semiconductor waveguide 30 is not Joule heating, but a heat transfer through Peltier-Seebeck effect.

Heating of the semiconductor waveguide 30 affects the refractive index of the semiconductor material of the semiconductor waveguide in the same manner as the cooling of the semiconductor waveguide 30 except for the reversal of the polarity of the change in the refractive index. In a similar manner as in the previous embodiment, temperature change in the semiconductor waveguide 30 may be advantageously employed to change the phase of light passing through the semiconductor waveguide. By modulating the refractive index of a semiconductor waveguide 30 through the temperature change in the semiconductor waveguide 30 caused by heat transfer into the semiconductor waveguide 30, the phase of the light passing through the semiconductor waveguide 30 may be modulated.

Figure 10:
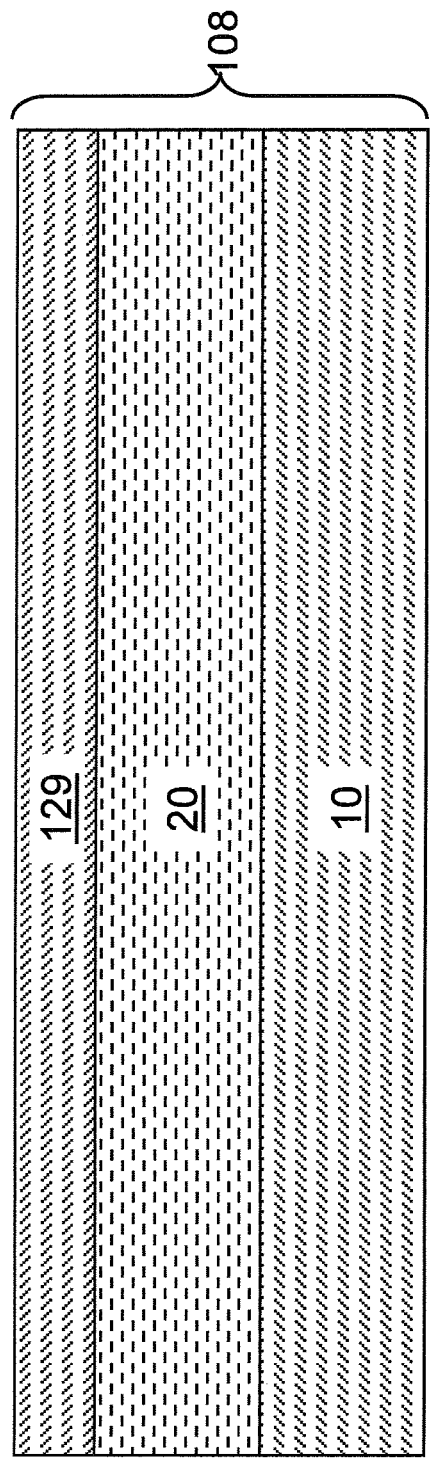
FIGS. 10, 11, and 12A, 12B, 13A, 13B, 14A, 14B, 15A, 15B, 16A, and 16B are various views of a second exemplary semiconductor structure corresponding to a second embodiment of the present invention.

Referring to FIG. 10, a second exemplary semiconductor structure according to a second embodiment of the present invention comprises a semiconductor substrate 108, which is a semiconductor-on-insulator (SOI) substrate. The SOI substrate includes a handle substrate 10, an insulator layer 20 abutting a top surface of the handle substrate 10, and a top semiconductor layer 129 located above the insulator layer 20. The insulator layer 20 and the handle substrate 10 provide structural support to the top semiconductor layer 129 which may comprise a contiguous semiconductor material layer that covers the entirety of the insulator layer 20. The top semiconductor layer 129 comprises a semiconductor material, which may be any of the material that may be employed for the contiguous semiconductor material layer of the first embodiment.

Preferably, the top semiconductor layer 129 comprises a substantially undoped semiconductor material so that the amount of impurities, including dopant atoms, in the top semiconductor layer 129 is minimized. By minimizing the amount of impurities in the contiguous material layer, a semiconductor waveguide having a low absorption rate of the signal may be subsequently formed from a portion of the top semiconductor layer. The atomic concentration of impurities, including dopants, in the top semiconductor layer 129 is less than about $1.0 \times 10^{16}/cm^3$, and preferably less than about $1.0 \times 10^{15}/cm^3$, and more preferably less than about $1.0 \times 10^{14}/cm^3$. In case the top semiconductor layer 129 comprises silicon, the resistivity of the material of the top semiconductor layer 129 is greater than about 1 Ohm-cm, and preferably greater than about 10 Ohm-cm, and more preferably greater than about 100 Ohm-cm.

The buried insulator layer 20 comprises a dielectric material such as a dielectric oxide, a dielectric nitride, or a dielectric oxynitride. For example, the buried insulator layer 20 may comprise silicon oxide. The buried insulator layer 20 may comprise a dielectric material having a dielectric constant greater than 3.0.

The handle substrate 10 may comprise a semiconductor material, an insulator material, a conductive material, or a combination thereof. In case the handle substrate 10 comprises a semiconductor material, the material for the handle substrate 10 may comprise any of the semiconductor material that may be employed for the top semiconductor layer 129 as described above.

Figure 11:
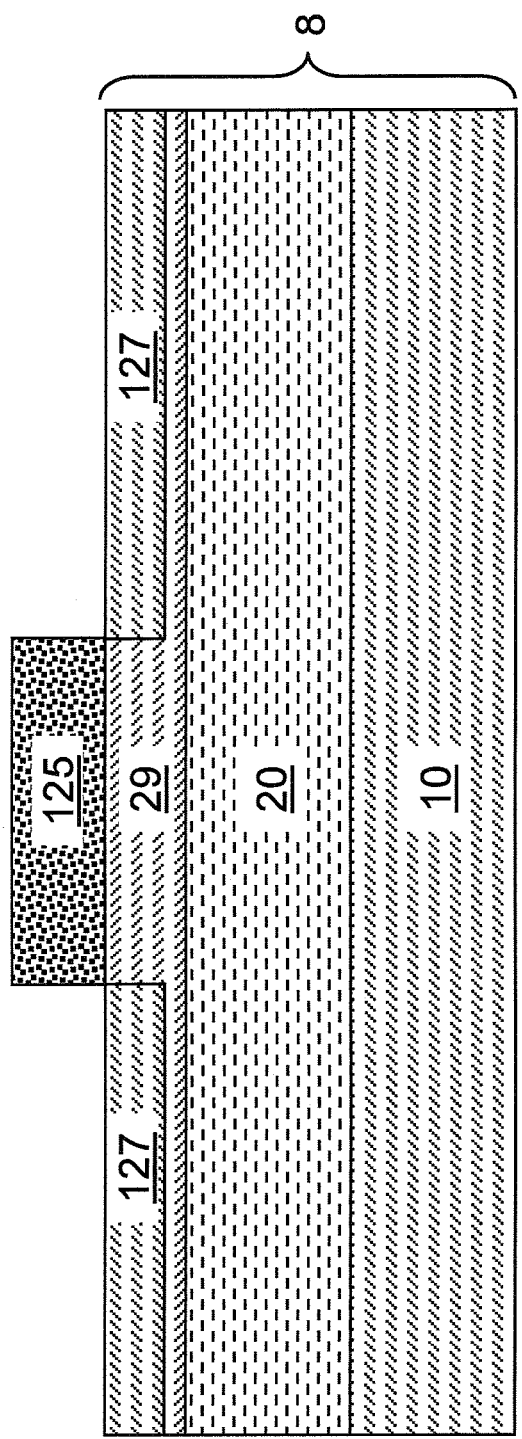

Referring to FIG. 11, a hard mask layer 125 may be deposited on a top surface of the top semiconductor layer 129 and lithographically patterned to mask a portion of the top semiconductor layer 129, while exposing other portions of the top semiconductor layer 129. The hard mask layer 125 comprises a dielectric material such as silicon oxide, silicon nitride, or silicon oxynitride. The exposed portions of the top semiconductor layer 129 are recessed. An epitaxial semiconductor layer 127 may be deposited on the recessed surface of the top semiconductor layer 129. The epitaxial semiconductor layer may comprise a different semiconductor material than the top semiconductor layer 129. The material of the epitaxial semiconductor layer 127 is single crystalline, and is epitaxially aligned to semiconductor material of the top semiconductor layer 127. For example, the top semiconductor layer 129 may comprise single crystalline silicon, and the epitaxial semiconductor layer 127 may comprise a silicon germanium alloy.

The hard mask layer 125 is subsequently removed. The top surface of the top semiconductor portions of the top semiconductor layer 129 may be planarized, for example, by chemical mechanical planarization.

Figure 12A:
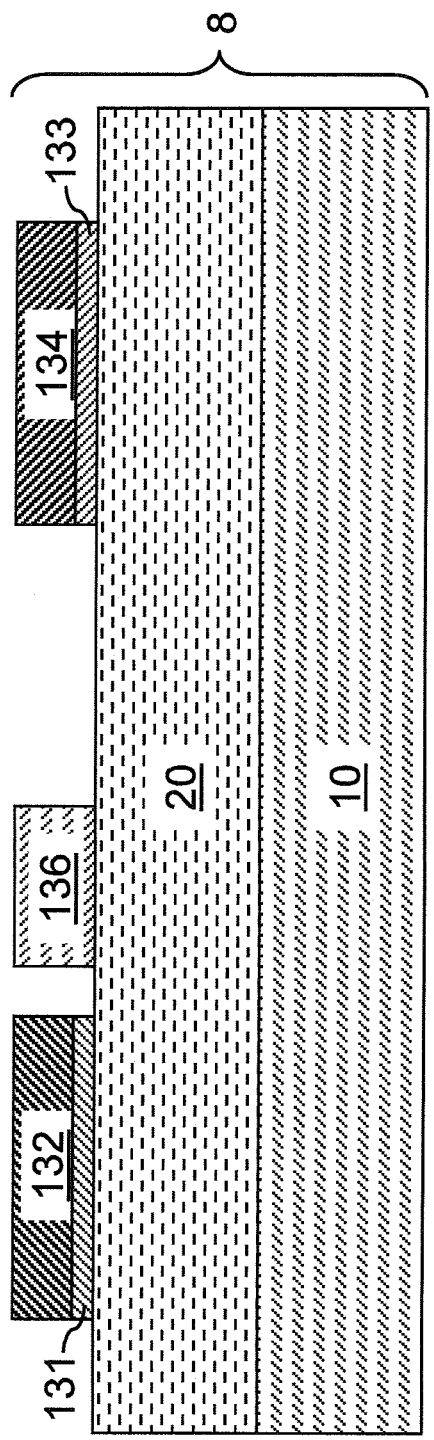
Figure 12B:
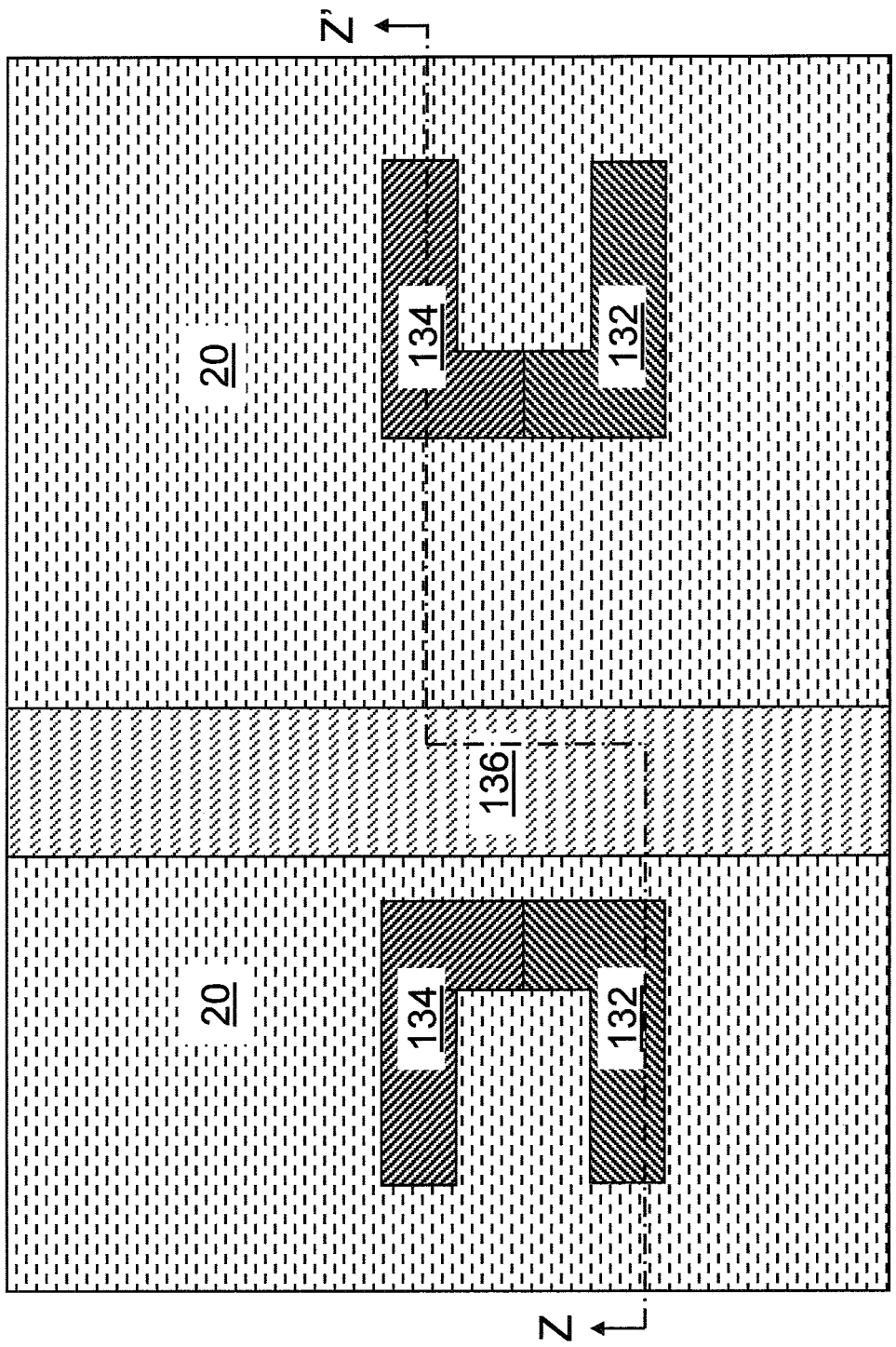

Referring to FIGS. 12A and 12B, portions of the top semiconductor layer 129 are appropriately doped and patterned to form at least one p-doped semiconductor portion (131, 132) and at least one n-doped semiconductor portion (133, 134). Each of the at least one p-doped semiconductor region (131, 132) may comprise a lower p-doped semiconductor region 131 and an upper p-doped semiconductor region 132. Each of the at least one n-doped semiconductor region (133, 134) may comprise a lower n-doped semiconductor region 133 and an upper n-doped semiconductor region 134. In addition, a semiconductor waveguide 136 may be formed by a patterning another portion of the top semiconductor layer 129 without implanting additional dopant atoms. In this case, the semiconductor waveguide may comprise a substantially intrinsic semiconductor material having the same composition as the at least one p-doped semiconductor portion (131, 132) and the at least one n-doped semiconductor portion (133, 134) except for dopant species and dopant concentration. The substantially intrinsic semiconductor material may have a resistivity greater than 1 Ohm-cm as the material of the top semiconductor layer 129 described above. In one case, the semiconductor waveguide 136 may consist essentially of silicon, and the at least one lower p-doped semiconductor region 131 may consist essentially of p-doped silicon, and the at least one n-doped semiconductor region 133 may consist essentially of n-doped silicon.

The at least one upper p-doped semiconductor portion 132 may be formed by implanting p-type dopants into at least one portion of the epitaxial semiconductor layer 127 through at least one opening in a first implantation mask layer (not shown), which may be a first patterned photoresist layer. The at least one lower p-doped semiconductor portion 131 may be formed by implanting p-type dopants into at least one portion of the top semiconductor layer 129 through the at least one opening in the first implantation mask layer. The at least one upper n-doped semiconductor portion 134 may be formed by implanting n-type dopants into at least one portion of the epitaxial semiconductor layer 127 through at least one opening in a second implantation mask layer (not shown), which may be a second patterned photoresist layer. The at least one lower n-doped semiconductor portion 133 may be formed by implanting n-type dopants into at least one portion of the top semiconductor layer 129 through the at least one opening in the second implantation mask layer.

After implantation of the p-type dopants and the n-type dopants, the top semiconductor layer 129 is lithographically patterned. The remaining portions of the epitaxial semiconductor layer 127 and the top semiconductor layer 129 after lithographic patterning include the at least one p-doped semiconductor portion (131, 132), the at least one n-doped semiconductor portion (133, 134), and optionally, the semiconductor waveguide 136. Thus, the heights of the at least one p-doped semiconductor portion (131, 132), the at least one n-doped semiconductor portion (133, 134), and the semiconductor waveguide 136 are substantially the same at this step.

Each of the at least one p-doped semiconductor portion (131, 132) may laterally abut the at least one n-doped semiconductor portion (133, 134). Alternately, a substantially undoped semiconductor material portion (not shown) having the same composition as the semiconductor waveguide 136 may be formed between one of the at least one p-doped semiconductor portion (131, 132) and the at least one n-doped semiconductor portion (133, 134).

Figure 13A:
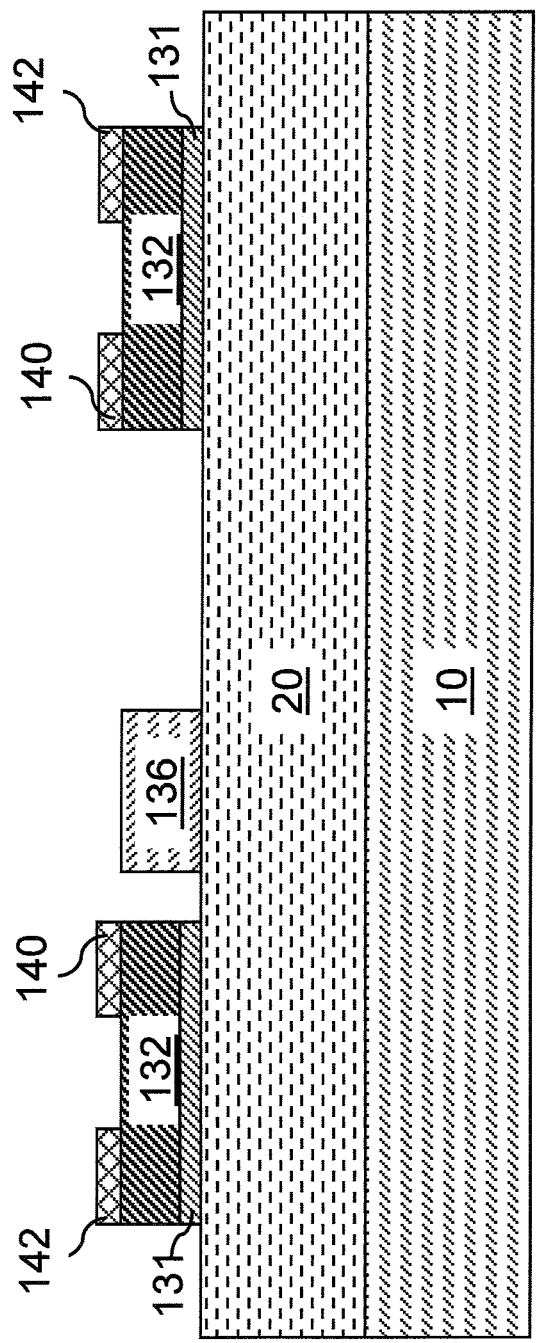
Figure 13B:
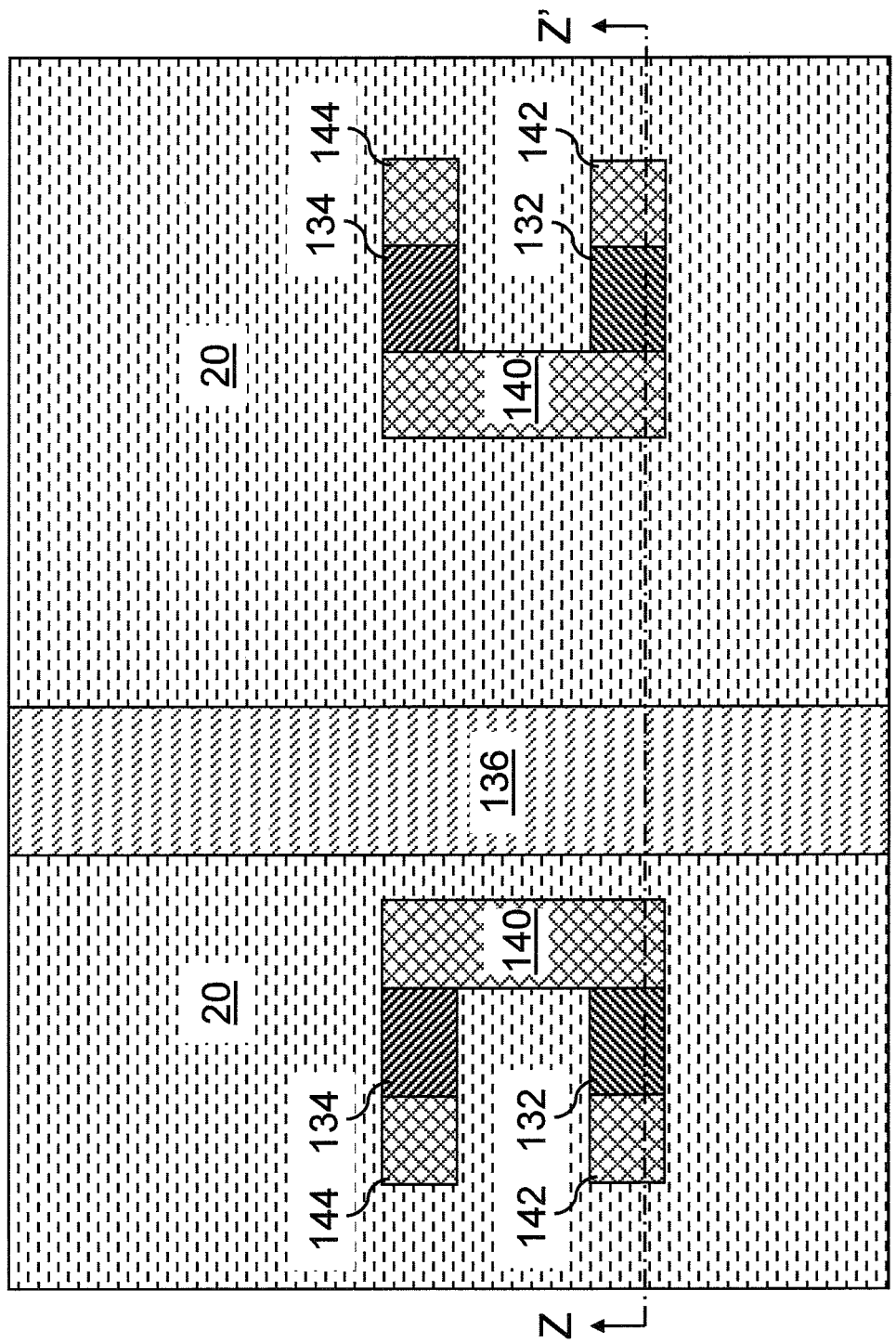

Referring to FIGS. 13A and 13B, metal semiconductor alloy regions are formed on the sub-portions of the at least one upper p-doped semiconductor portion 132 and the at least one upper n-doped semiconductor portion 134. Specifically, a first metal semiconductor alloy region 140 is formed on each laterally abutting pair of a first sub-portion of the at least one p-doped semiconductor portion (131, 132) and a first sub-portion of the at least one n-doped semiconductor portion (133, 134). Each first metal semiconductor alloy region 140 is contiguous.

A second metal semiconductor alloy region 142 is formed on a second sub-portion of each of the at least one upper p-doped semiconductor portion 132. The second sub-portion of each of the at least one upper p-doped semiconductor portion 132 is located on an opposite end of the first sub-portion of that p-doped semiconductor portion 134. In each of the at least one p-doped semiconductor portion (131, 132), a middle sub-portion of the p-doped semiconductor portion (131, 132) that does not underlie a metal semiconductor alloy region separates, and laterally abuts, a first sub-portion of the p-doped semiconductor portion (131, 132) and a second sub-portion of the p-doped semiconductor portion (131, 132). Each of the at least one p-doped semiconductor portion (131, 132) includes a first sub-portion located directly underneath a portion of a first metal semiconductor alloy region 140, a second sub-portion located directly underneath a second metal semiconductor alloy region 142, and a middle sub-portion that laterally separates the first sub-portion and the second sub-portion of that p-doped semiconductor portion (131, 132).

A third metal semiconductor alloy region 144 is formed on a second sub-portion of each of the at least one upper n-doped semiconductor portion 134. The second sub-portion of each of the at least one upper n-doped semiconductor portion 134 is located on an opposite end of the first sub-portion of that n-doped semiconductor portion (133, 134). In each of the at least one n-doped semiconductor portion (133, 134), a middle sub-portion of the n-doped semiconductor portion (133, 134) that does not underlie a metal semiconductor alloy region separates, and laterally abuts, a first sub-portion of the n-doped semiconductor portion (133, 134) and a second sub-portion of the n-doped semiconductor portion (133, 134). Each of the at least one n-doped semiconductor portion (133, 134) includes a first sub-portion located directly underneath a portion of a first metal semiconductor alloy region 140, a second sub-portion located directly underneath a third metal semiconductor alloy region 144, and a middle sub-portion that laterally separates the first sub-portion and the second sub-portion of that p-doped semiconductor portion (131, 132).

The metal semiconductor alloy regions (140, 142, 144) may be formed by depositing an insulator layer (not shown), patterning openings in the insulator layer in areas in which the metal semiconductor alloy regions (140, 142, 144) are to be formed, depositing a metal layer, reacting the material of the metal layer with the underlying semiconductor material, and removing unreacted portions of the metal layer. The insulator layer may, or may not, be subsequently removed. The metal layer comprises a metal that reacts with the underlying semiconductor material of the at least one p-doped semiconductor portion (131, 132) and the at least one n-doped semiconductor portion (133, 134). Non-limiting examples of the metal that may be employed as the material of the metal layer include Co, Ta, Ti, W, Ni, Pt, Os, and Ir. In case the underlying semiconductor material comprises silicon, the metal semiconductor alloy regions (140, 142, 144) may comprise a metal silicide. The thickness of the metal semiconductor alloy regions (140, 142, 144) may be from 10 nm to 100 nm, although lesser and greater thicknesses can also be employed.

Figure 14A:
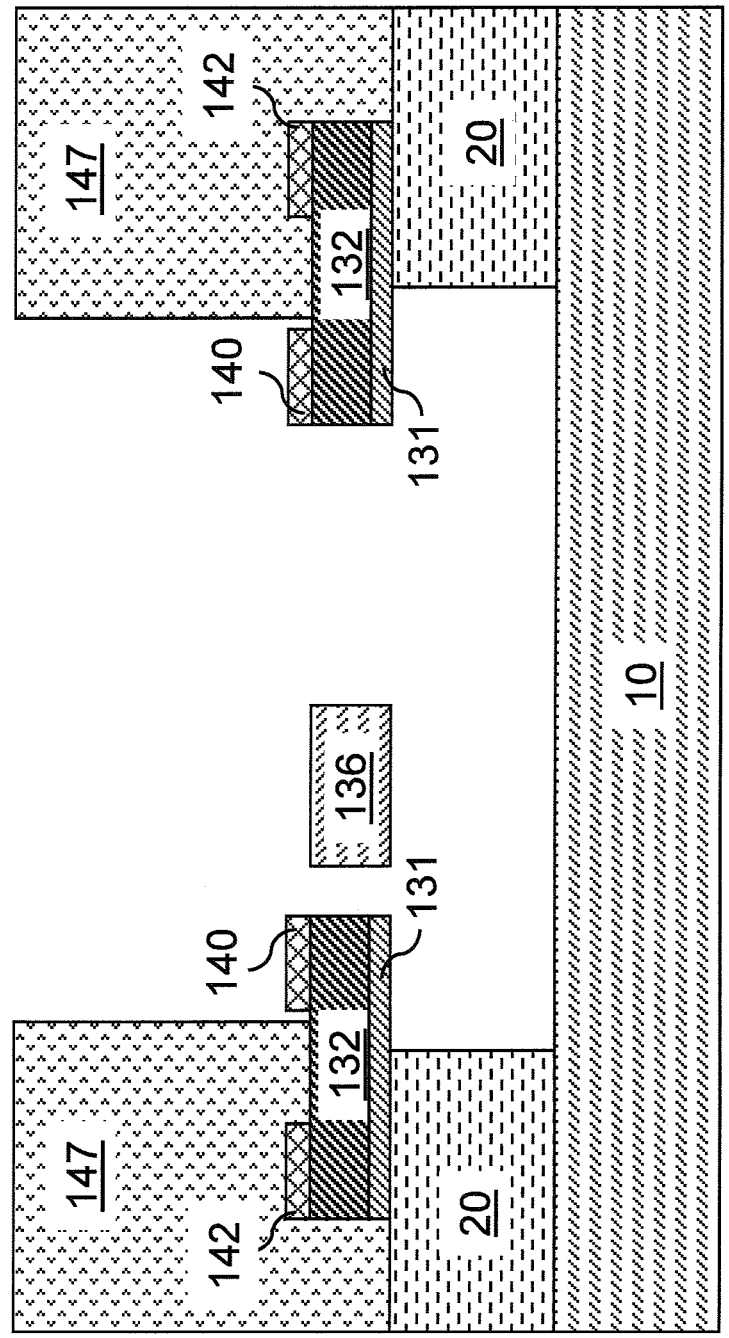
Figure 14B:
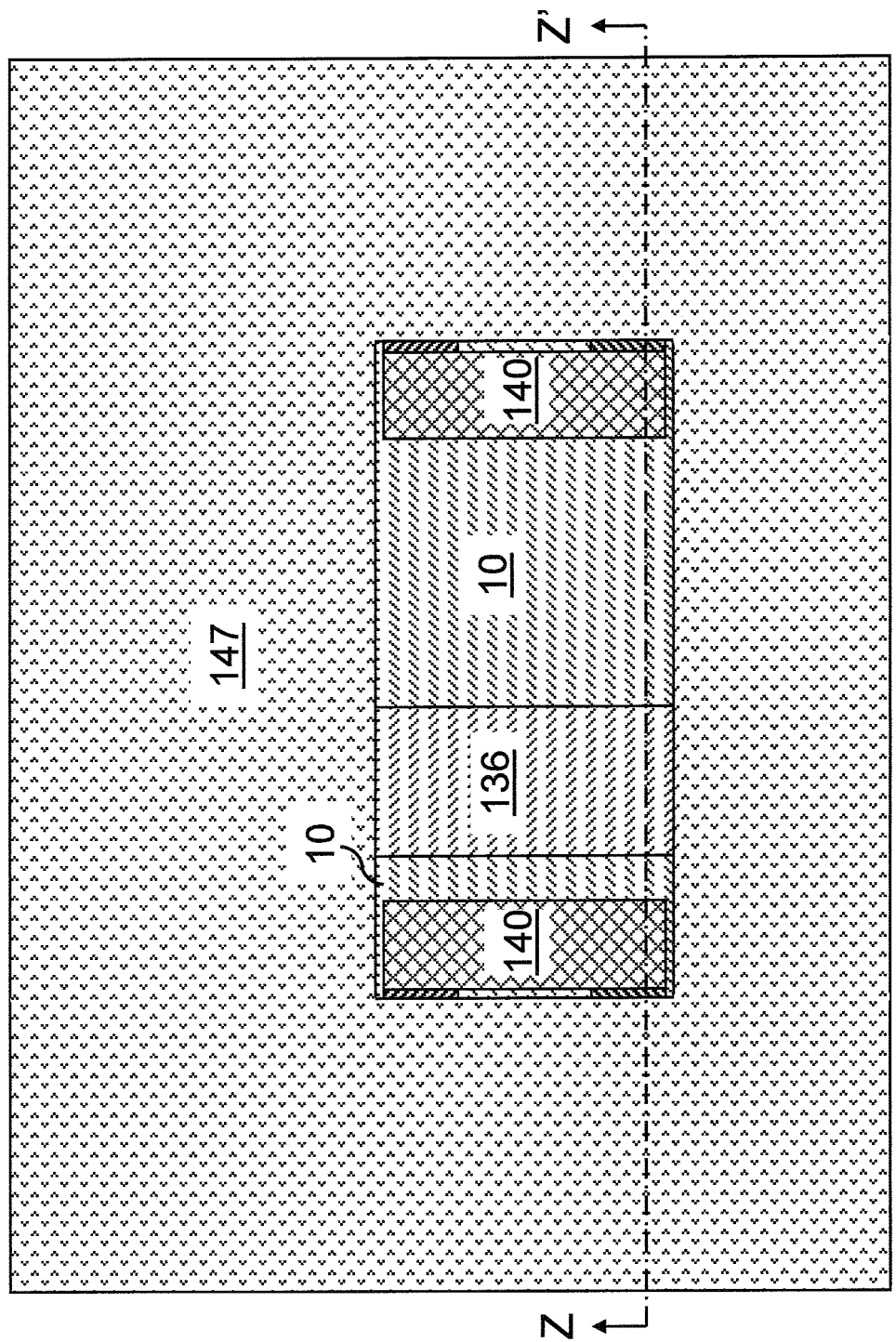

Referring to FIGS. 14A and 14B, a photoresist 147 is applied over the top surface of the second exemplary semiconductor structure. An opening is formed in the photoresist 147 by lithographic patterning. The at least one first metal semiconductor alloy region 140 is exposed within the opening in the photoresist 147. A portion of the semiconductor waveguide 136 may be exposed within the opening in the photoresist 147. Not necessarily but preferably, edges of the photoresist 147 may overlie the middle sub-portion(s) of the at least one p-doped semiconductor portion (131, 132) and the middle sub-portion(s) of the at least one n-doped semiconductor portion (133, 134).

Portions of the top surface of the buried insulator layer 20 are exposed within the opening in the photoresist 147. The exposed portions of the buried insulator layer 20 are removed from underneath the opening in the photoresist 147 by an etch, which may be an isotropic etch or an anisotropic etch. The photoresist 147 protects covered portions of the buried insulator layer 20 from the etch. The etch is selective to the metal semiconductor alloy portions (140, 142, 144), the at least one p-doped semiconductor portion (131, 132), the at least one n-doped semiconductor portion (133, 134), and the semiconductor waveguide 136. A trench is formed within the buried insulator layer 20 underneath the opening in the photoresist 147. A top surface of the handle substrate 10 may be exposed underneath the trench in the buried insulator layer 20.

The trench may undercut the at least one p-doped semiconductor portion (131, 132), the at least one n-doped semiconductor portion (133, 134), and a portion of the semiconductor waveguide 136. Preferably, the undercut of the at least one p-doped semiconductor portion (131, 132), the at least one n-doped semiconductor portion (133, 134), and a portion of the semiconductor waveguide 136 is controlled to prevent a complete dissociation from the top surface of the buried insulator layer 20 and to insure that each of the at least one p-doped semiconductor portion (131, 132), the at least one n-doped semiconductor portion (133, 134), and a portion of the semiconductor waveguide 136 remains attached to the buried insulator layer 20. Preferably, the edge of the trench in the buried insulator layer 20 is directly adjoined to the middle sub-portion(s) of the at least one p-doped semiconductor portion (131, 132) and the middle sub-portion(s) of the at least one n-doped semiconductor portion (133, 134). Each of the first sub-portion of the at least one p-doped semiconductor portion (131, 132) and each of the first sub-portion of the at least one n-doped semiconductor portion (133, 134) may laterally protrude from the edges of the trench within the buried insulator layer 20, and overhang above the trench in the buried insulator layer 20. The remaining portions of the buried insulator layer 20 constitute at least one dielectric material portion that vertically abuts the bottom surfaces of the second sub-portion(s) of the at least one p-doped semiconductor portion (131, 132) and the second sub-portion(s) of the at leas one n-doped semiconductor portion (133, 134).

Figure 15A:
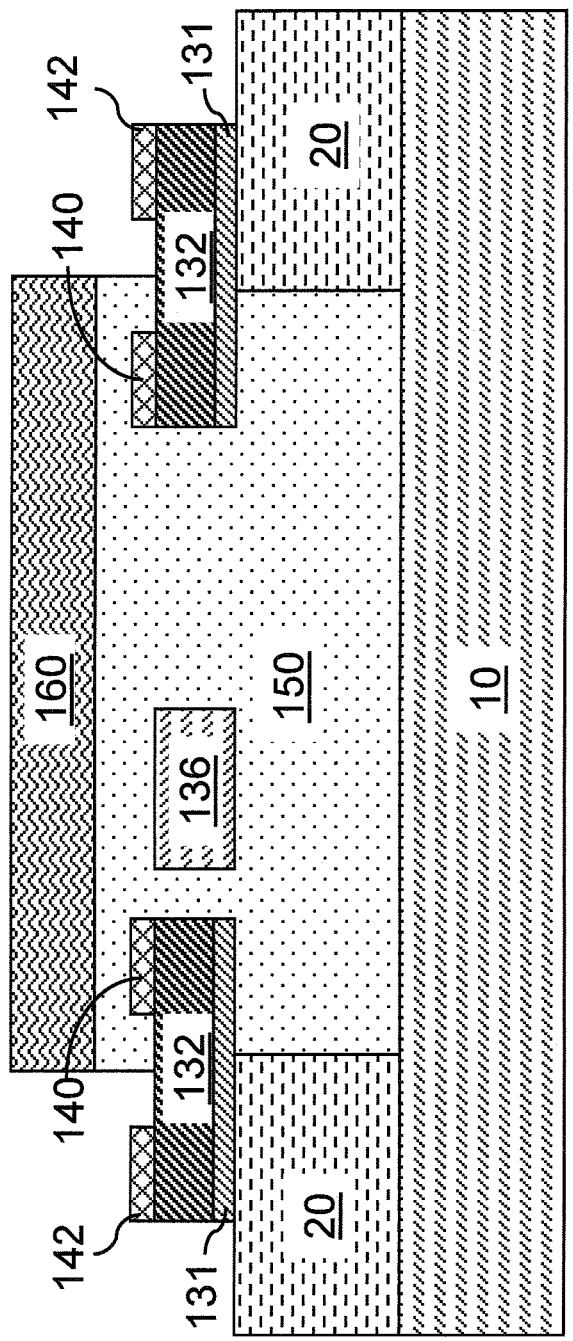
Figure 15B:
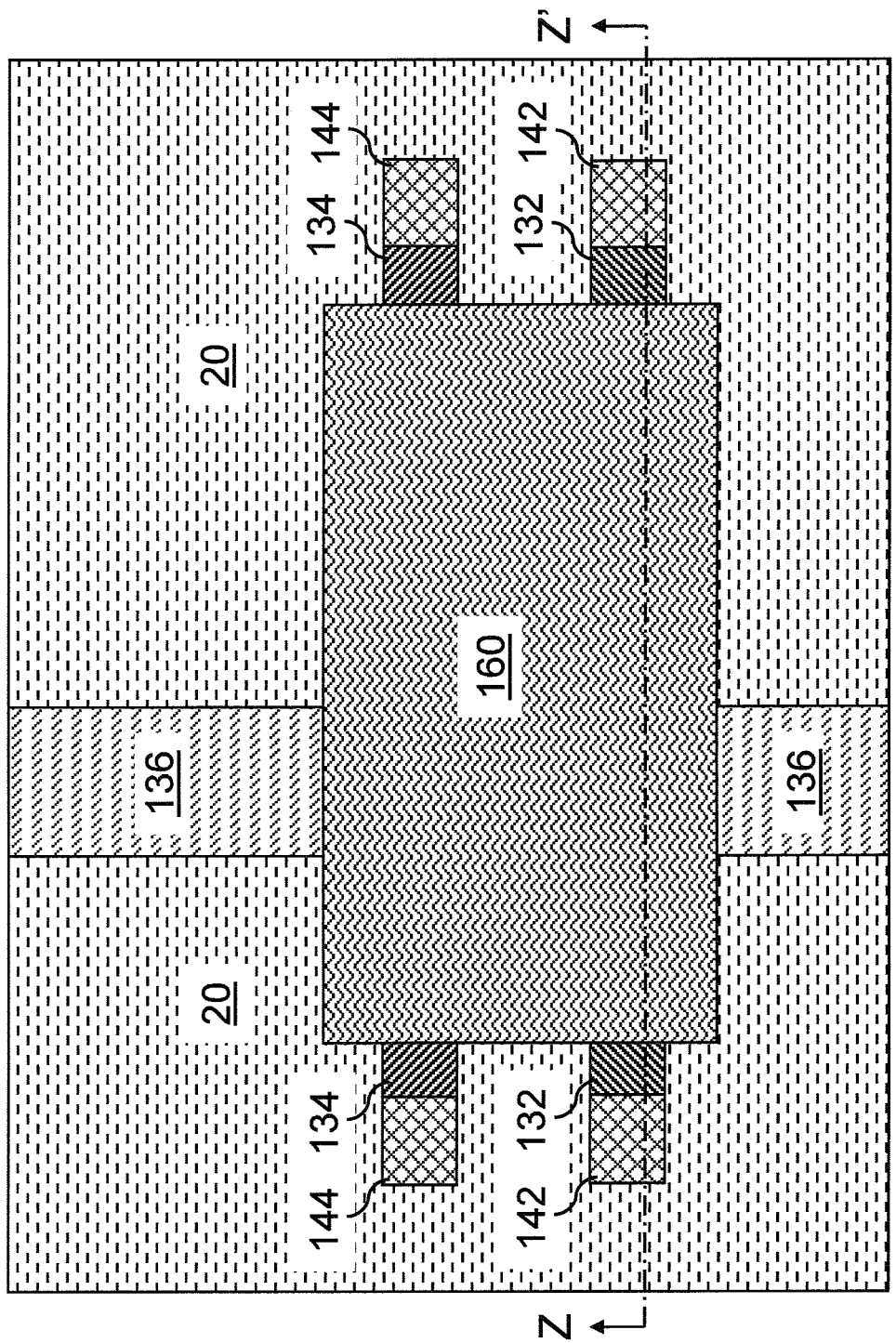

Referring to FIGS. 15A and 15B, the trench in the buried insulator layer 20 is filled with a dielectric material. Preferably, the dielectric material filling the trench in the buried insulator layer 20 comprises a different material than the dielectric material of the buried insulator layer 20. Preferably, the dielectric material filling the trench comprises a low dielectric constant (low-k) material having a dielectric constant less than 3.0. In this case, the dielectric material filling the trench constitutes a low dielectric constant (low-k) dielectric material portion 150. The low-k dielectric material portion 150 laterally abuts the buried insulator layer 20 and vertically abuts the bottom surfaces of the first sub-portion(s) of the at least one p-doped semiconductor portion (131, 132) and the first sub-portion(s) of the at leas one n-doped semiconductor portion (133, 134). The interface between the buried insulator layer 20 and the low-k dielectric material portion 150 may be located underneath the middle sub-portion(s) of the at least one p-doped semiconductor portion (131, 132) and the middle sub-portion(s) of the at least one n-doped semiconductor portion (133, 134).

The dielectric material portion of the buried insulator layer 20 comprises a dielectric material having a second edge underlying the middle sub-portion(s) of the at least one p-doped semiconductor portion (131, 132) located between one of the at least one first metal semiconductor region 140 and one of the at least one second metal semiconductor region 142 and having a third edge underlying a middle sub-portion(s) of the at least one n-doped semiconductor portion (133, 134) located between one of the at least one first metal semiconductor region 140 and the at least one third metal semiconductor region 144. Further, the low-k dielectric material portion 150 comprises a dielectric material having a second edge underlying the middle sub-portion(s) of the at least one p-doped semiconductor portion (131, 132) located between one of the at least one first metal semiconductor region 140 and one of the at least one second metal semiconductor region 142 and having a third edge underlying a middle sub-portion(s) of the at least one n-doped semiconductor portion (133, 134) located between one of the at least one first metal semiconductor region 140 and the at least one third metal semiconductor region 144.

Exemplary low-k dielectric materials that may be employed for the low-k dielectric material portion 150 include, but are not limited to, fluorinated or non-fluorinated organic polymer based low k materials such as Dow Chemical's SiLK™ dielectric, Honeywell's Flare™, polyimides, benzocyclobutene, polybenzoxazoles, aromatic thermoset polymers based on polyphenylene ethers, chemical vapor deposited polymers such as poly(p-xylylene), and organosilicate glasses (OSG's) that may be deposited by chemical vapor deposition. Organosilicate glasses contain a matrix of a hydrogenated oxidized silicon carbon material (SiCOH) comprising atoms of Si, C, O and H in a covalently bonded tri-dimensional network, and may be referred to as SiCOH dielectric materials. The low-k dielectric materials may be porous or non-porous. Typically, the low-k dielectric material of the low-k dielectric material portion 150 has less thermal conductivity than the dielectric material of the buried insulator layer 20. The low-k dielectric material portion 150 as deposited may cover the entirety of the second exemplary semiconductor structure. Preferably, the top surface of the low-k dielectric material portion 150 is planar, which may be effected by depositing a self-planarizing low-k dielectric material or by planarizing a non-self-planarizing low-k dielectric material layer by chemical mechanical planarization, a recess etch, or a combination thereof.

An optoelectronic device 160 is formed on the top surface of the low-k dielectric material portion 150. The optoelectronic device may be any device that manipulates an optical signal, i.e., electromagnetic radiation. The optical signal may be in the ultraviolet range, in the visible spectrum, in the infrared range, or in a microwave range. The optoelectronic device 160 may include a plurality of devices that manipulate at least one optical signal and may, or may not, be interconnected amongst one another. The optoelectronic device 160 may, or may not, be optically coupled to the semiconductor waveguide 136. In case the optoelectronic device 160 is optically coupled to the semiconductor waveguide 136, the optoelectronic device 160 may manipulate the optical signal that are fed into, or received from, the semiconductor waveguide 136. The optoelectronic device 160 may include at least one of a laser, optical amplifier, an optical sensor, a waveguide, a quantum well, or any other device that may manipulate an optical signal. The optoelectronic device 160 may comprise any semiconductor material that may be employed for the top semiconductor layer 129 as described above. Particularly, the optoelectronic device 160 may comprise a III-V compound semiconductor material such as GaAs, $In_xGa_{1-x}As$, $Al_xIn_yGa_{1-x-y}As$, InP, $In_xGa_{1-x}As_yP_{1-y}$, etc. The range of x, y, and 1-x-y are between 0 and 1. The optoelectronic device 160 may comprise a doped semiconductor material or an undoped semiconductor material.

Optionally, the region of the low-k dielectric material portion 150 that is not covered by the optoelectronic device 160 may be etched by an etch that is selective to the optoelectronic device, the second and third metal semiconductor alloy regions (142, 144), the at least one p-doped semiconductor portion (131, 132), and the at least one n-doped semiconductor portion (133, 134).

Figure 16A:
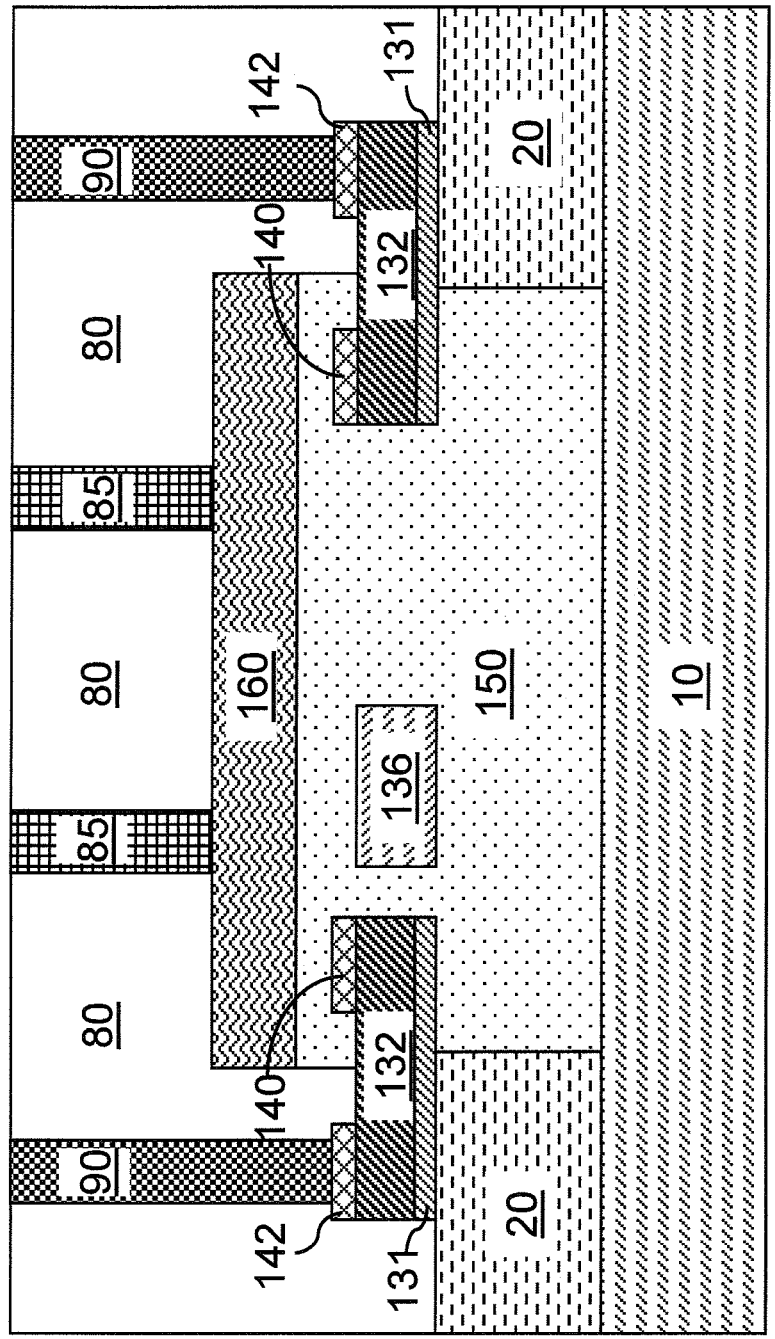
Figure 16B:
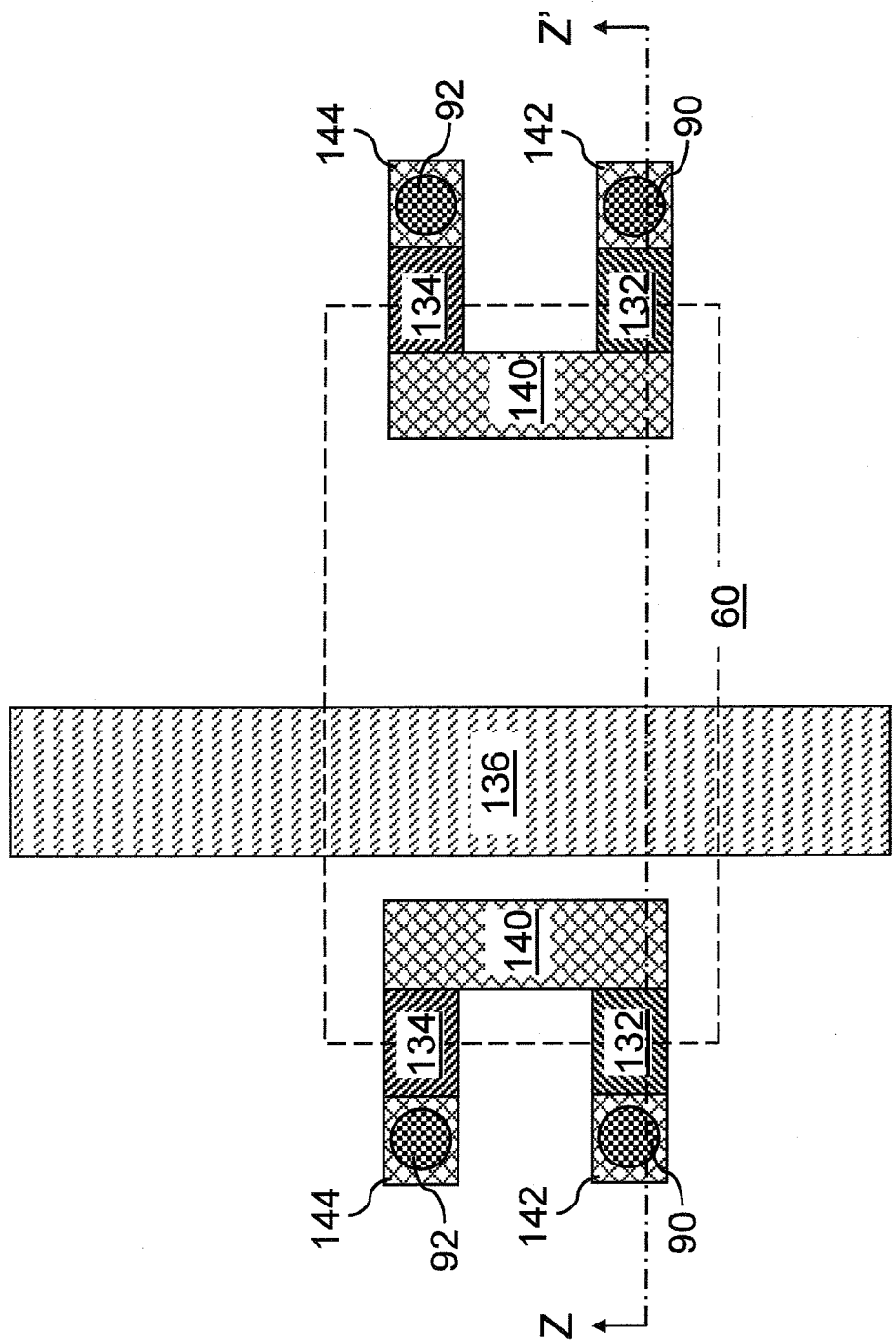

Referring to FIGS. 16A and 16B, an interconnect-level dielectric material layer 80 is formed over the optoelectronic device 160 and the exposed portions of the buried insulator layer 20, the at least one second metal semiconductor alloy region 142, the at least one third metal semiconductor alloy region 144, the at least one p-doped semiconductor portion (131, 132), and the at least one n-doped semiconductor portion (133, 134). FIG. 16A is a vertical cross-sectional view along the vertical plane Z-Z' in FIG. 16B, and FIG. 16B is a top-down view of selected elements including the at least one p-doped semiconductor portion (131, 132), the at least one first metal semiconductor alloy region 140, the at least one second metal semiconductor alloy region 142, the at least one third metal semiconductor alloy region 144, and the semiconductor waveguide 136. The location of the optoelectronic device 160 is shown in a broken line. The interconnect-level dielectric material layer 80 comprises a dielectric material, which may comprise any of the dielectric material that may be employed for the buried insulator layer or the low-k dielectric material portion 150. Additionally or alternately, the interconnect-level dielectric material layer 80 may comprise a doped silicate glass such as phosphosilicate glass (PSG), borosilicate glass (BSG), borophosphosilicate glass (BPSG), fluorosilicate glass (FSG), etc. The interconnect-level dielectric material layer 80 may further include other dielectric materials as well.

A first set of via holes may be formed in the interconnect-level dielectric material layer 80 above the optoelectronic device 160 and filled with a compound semiconductor material to form at least one compound semiconductor via 85. Each of the at least one compound semiconductor via vertically abuts the optoelectronic device 160 and provides conduction of electrical current or transmission of light to or from the optoelectronic device 160.

A second set of via holes is formed in the interconnect-level dielectric material layer 80 above each of the at least one second metal semiconductor alloy region 142 and the at least one third metal semiconductor alloy region 144. At least one first metal contact via 90 abutting each of the at least one second metal semiconductor alloy region 142 and at least one second metal contact via 92 abutting each of the at least one third metal semiconductor alloy region 144 are formed within the second set of via holes by filling the second set of via holes with a conductive metal and removing excess metal from above the top surface of the interconnect-level dielectric material layer 80. The at least one first metal contact via 90 and the at least one second metal contact via 92 comprises a metallic material such as W, Ta, Ti, WN, TaN, TiN, Cu, and Al. Other metallic materials may also be employed instead of, or in addition to, the metallic material described above.

Each adjoined set of a first metal contact via 90, a second metal semiconductor alloy region 142, a p-doped semiconductor portion (131, 132), a first metal semiconductor alloy region 140, an n-doped semiconductor portion (133, 134), a third metal semiconductor alloy region 144, and a second metal contact via 92 constitutes a temperature control device (90, 142, 131, 132, 140, 133, 134, 144, 92). Each temperature control device (90, 142, 131, 132, 140, 133, 134, 144, 92) is configured to provide a path for conduction of electrical current.

The path for conduction of electrical current may be from a second metal contact via 92, then through a third metal semiconductor alloy region 144, then through an n-doped semiconductor portion (133, 134), then through a first metal semiconductor alloy region 140, then through a p-doped semiconductor portion (131, 132), then through a second metal semiconductor alloy region 142, and then to a first metal contact via 90. This direction of current flow is herein referred to as a forward current direction. Alternately, the path for conduction of electrical current may be from a first metal contact via 90, then through a second metal semiconductor alloy region 142, then through a p-doped semiconductor portion (131, 132), then through a first metal semiconductor alloy region 140, then through an n-doped semiconductor portion (133, 134), then through a third metal semiconductor alloy region 144, and then to a second metal contact via 92. This direction of current flow is herein referred to as a reverse current direction.

Each temperature control device (90, 142, 131, 132, 140, 133, 134, 144, 92) is thermally coupled to the optoelectronic device 160, which comprises a semiconductor material and is configured to manipulate electromagnetic radiation, i.e., an optical signal.

As electrical current flows through each of the at least one temperature control device (90, 142, 131, 132, 140, 133, 134, 144, 92), heat is transferred in the direction of the flow of the majority charge carrier. This is because the mechanism of Peltier-Seebeck effect is in operation in the at least one p-doped semiconductor portion (131, 132) and the at least one n-doped semiconductor portion (133, 134). According to Peltier-Seebeck effect, heat transfer accompanies diffusion of charge carriers in a semiconductor material and vice versa.

If the electrical current flows in the forward current direction, the majority charge carriers diffuse away from the interface with one of the at least one first metal semiconductor alloy region 140 and toward the interface with one of the at least one second metal semiconductor alloy region 142 and the at least one third metal semiconductor alloy region 144 within the p-doped semiconductor portion (131, 132) and the n-doped semiconductor region 134 of each temperature control device (90, 142, 131, 132, 140, 133, 134, 144, 92). The majority charge carriers are holes in the at least one p-doped semiconductor portion (131, 132), and are electrons in the at least one n-doped semiconductor region 134. The heat is further transferred to the at least one first metal contact via 90 and the at least one second metal contact via 92. Because of the thermal coupling between the at least one first metal semiconductor alloy region 140 and the optoelectronic device 160, the heat is also transferred from the optoelectronic device 160 to the at least one first metal semiconductor alloy region 140 as the at least one first metal semiconductor alloy region 140 is cooled. Therefore, there is a net heat transfer from the optoelectronic device 160 to the at least one first metal contact via 90 and the at least one second metal contact via 92. The heat that is transferred to the at least one first metal contact via 90 and the at least one second metal contact via 92 may further be transferred to a heat sink (not shown) through metallic interconnect structures embedded in the interconnect-level dielectric material layer 80.

If the electrical current flows in the reverse current direction, the majority charge carriers diffuse toward the interface with one of the at least one first metal semiconductor alloy region 140 and away from the interface with one of the at least one second metal semiconductor alloy region 142 and the at least one third metal semiconductor alloy region 144 within the p-doped semiconductor portion (131, 132) and the n-doped semiconductor region 134 of each temperature control device (90, 142, 131, 132, 140, 133, 134, 144, 92). The transferred heat accumulates at the at least one second metal semiconductor alloy region 142 and the at least one third metal semiconductor alloy region 144. Because of the thermal coupling between the at least one first metal semiconductor alloy region 140 and the optoelectronic device 160, the heat is further transferred from the at least one first metal semiconductor alloy region 140 to the optoelectronic device 160 as the at least one first metal semiconductor alloy region 140 is heated by heat transfer. Therefore, there is a net heat transfer from the at least one first metal contact via 90 and the at least one second metal contact via 92 to the optoelectronic device 160. The heat may be transferred from a heat sink (not shown) to the at least one first metal contact via 90 and the at least one second metal contact via 92 through metallic interconnect structures embedded in the interconnect-level dielectric material layer 80, then subsequently transferred to the optoelectronic device 160.

Therefore, by reversing the direction of flow of the electrical current, the direction of heat transfer may be reversed. Further, by adjusting the magnitude of the electrical current, the amount of heat transfer may be regulated. Typically, the material of the low-k dielectric material portion 150 has a lower thermal conductivity than the material of the buried insulator layer 20, thereby increasing the thermal isolation of the at least one first metal semiconductor alloy portion 140 and the optoelectronic device 160 from the handle substrate 10.

The first semiconductor device may be operated with a feedback mechanism for performance of the optoelectronic device 160. For example, the performance of the optoelectronic device 160 may be monitored during operation. Based on the monitored performance level of the optoelectronic device, a direction of the electrical current or magnitude of the electrical current may be manipulated to heat or cool the optoelectronic device, thereby reducing deviation in the performance of the optoelectronic device 160 from a target performance level.

Figure 17:
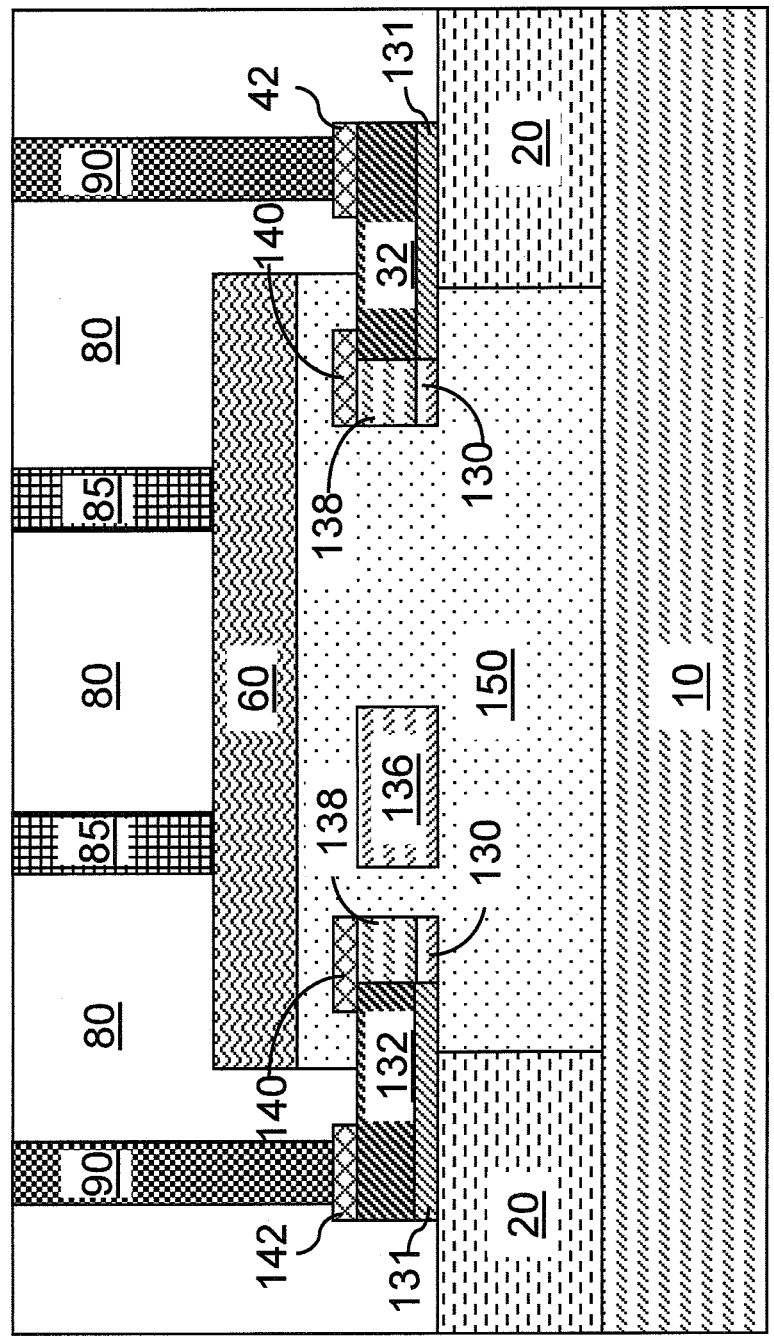
FIG. 17 is a vertical cross-sectional view of a third exemplary semiconductor structure.

Referring to FIG. 17, a third exemplary semiconductor structure according to a third embodiment of the present invention is derived from the second exemplary semiconductor structure by forming a substantially intrinsic lower semiconductor portion 30 and a substantially intrinsic upper semiconductor portion 138 in each temperature control device. A vertically abutting pair of a substantially intrinsic lower semiconductor portion 30 and a substantially intrinsic upper semiconductor portion 138 is herein referred to as a substantially intrinsic semiconductor portion (30, 138). Thus, each of the at least one temperature control device may include the substantially intrinsic semiconductor portion 30.

The substantially intrinsic semiconductor portion (30, 138) is formed between a p-doped semiconductor portion (131, 132) and an n-doped semiconductor portion (133, 134) of the at least one temperature control device (90, 142, 131, 132, 140, 30, 138, 133, 134, 144, 92). The substantially intrinsic semiconductor portion (30, 138) may have the same composition as the semiconductor waveguide 136. The substantially intrinsic semiconductor portion (30, 138) vertically abuts the first metal semiconductor alloy region 140 of the at least one temperature control device (90, 142, 131, 132, 140, 133, 134, 144, 92). In one case, the p-doped semiconductor portion (131, 132) and the n-doped semiconductor portion (133, 134) may be not abut each other, and are laterally separated by the substantially intrinsic semiconductor portion (30, 138). In another case, the p-doped semiconductor portion (131, 132) and the n-doped semiconductor portion (133, 134) may abut each other and the substantially intrinsic semiconductor portion (30, 138).

A low-k dielectric material portion 150, an optoelectronic device 160, an interconnect-level dielectric material layer 80, at least one compound semiconductor via 85, at least one first metal contact via 90, and at least one second metal contact via 92 may be formed in the same manner as in the second embodiment. Within the collective volume of the at least one substantially intrinsic semiconductor portion (30, 138) and the at least one first metal semiconductor alloy region 140, the current flows primarily through the at least one first metal semiconductor alloy region 140. Therefore, the addition of the at least one substantially intrinsic semiconductor portion (30, 138) does not change the current path in a substantial manner relative to the current path in the second embodiment. The at least one temperature control device (90, 142, 131, 132, 140, 30, 138, 133, 134, 144, 92) may be operated in the same manner as in the second embodiment to control the temperature of the optoelectronic device 160 and to regulate the performance of the optoelectronic device 160.

Figure 18:
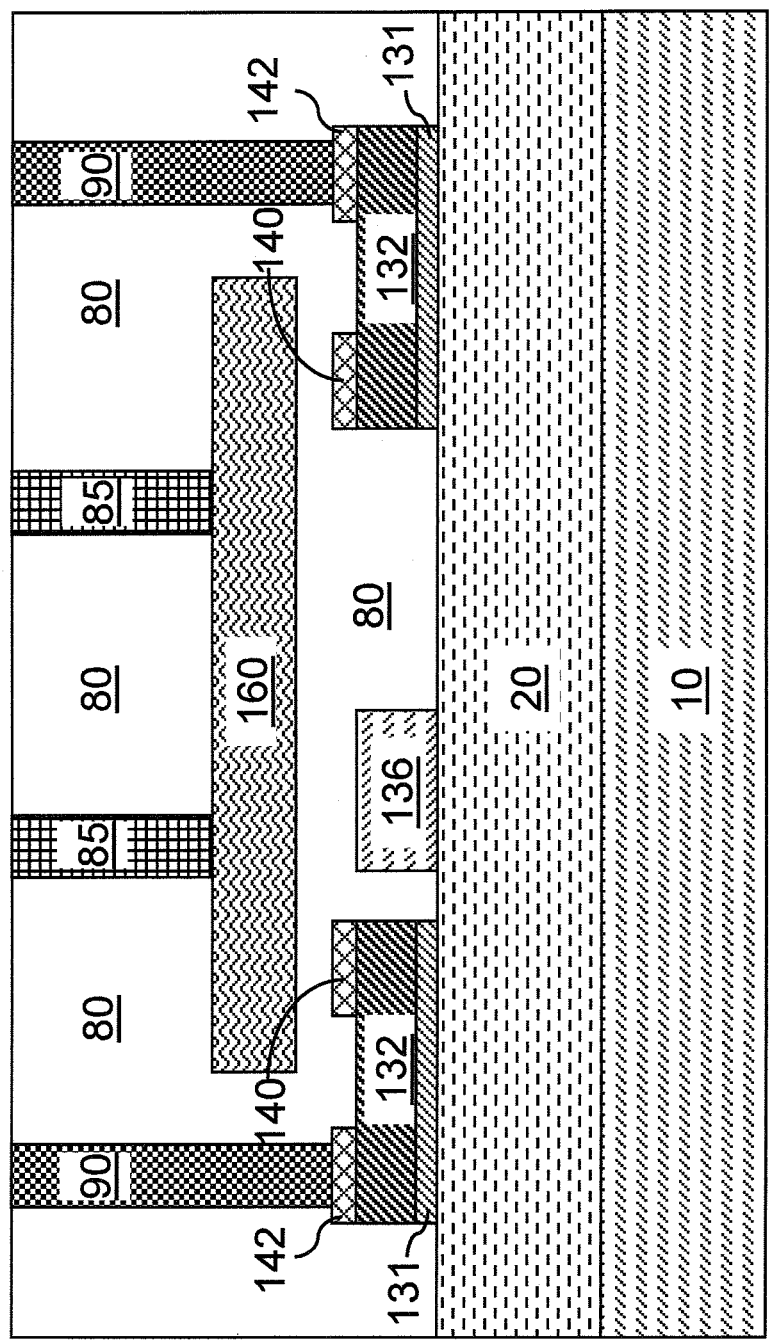
FIG. 18 is a vertical cross-sectional view of a fourth exemplary semiconductor structure.

Referring to FIG. 18, a fourth exemplary semiconductor structure according to a fourth embodiment of the present invention is shown. The fourth exemplary semiconductor structure is derived from the second exemplary semiconductor structure of FIGS. 13A and 4B by omitting the steps corresponding to FIGS. 14A and 5B in the processing sequence. Specifically, application of a photoresist 147, patterning of the photoresist 147, and transfer of the pattern in the photoresist 147 into an exposed portion of the buried insulator layer 20 are omitted in the third embodiment.

Instead of patterning the buried insulator layer 20, a lower portion of an interconnect-level dielectric material layer 80 is formed over the at least one temperature control device (90, 142, 131, 132, 140, 133, 134, 144, 92) and the semiconductor waveguide 136. The top surface of the lower portion of the interconnect-level dielectric material layer 80 is planarized by employing a self-planarizing material for the lower portion of the interconnect-level dielectric material layer 80 and/or by performing a planarization processing step such as chemical mechanical planarization or a recess etch. An optoelectronic device 160 is formed over the top surface of the lower portion of the interconnect-level dielectric material layer 80. The optoelectronic device 160 may be the same as in the second embodiment, and may overlie the at least one first metal semiconductor alloy region 140 and a portion of the semiconductor waveguide 136. An upper portion of the interconnect-level dielectric material layer 80 is formed over the optoelectronic device 160. The lower portion and the upper portion of the interconnect-level dielectric material layer 80 may comprise the same material as in the second embodiment. At least one compound semiconductor via 85, at least one first metal contact via 90, and at least one second metal contact via 92 may be formed in the same manner as in the second embodiment. The at least one temperature control device (90, 142, 131, 132, 140, 133, 134, 144, 92) may be operated in the same manner as in the second embodiment to control the temperature of the optoelectronic device 160 and to regulate the performance of the optoelectronic device 160.

Figure 19:
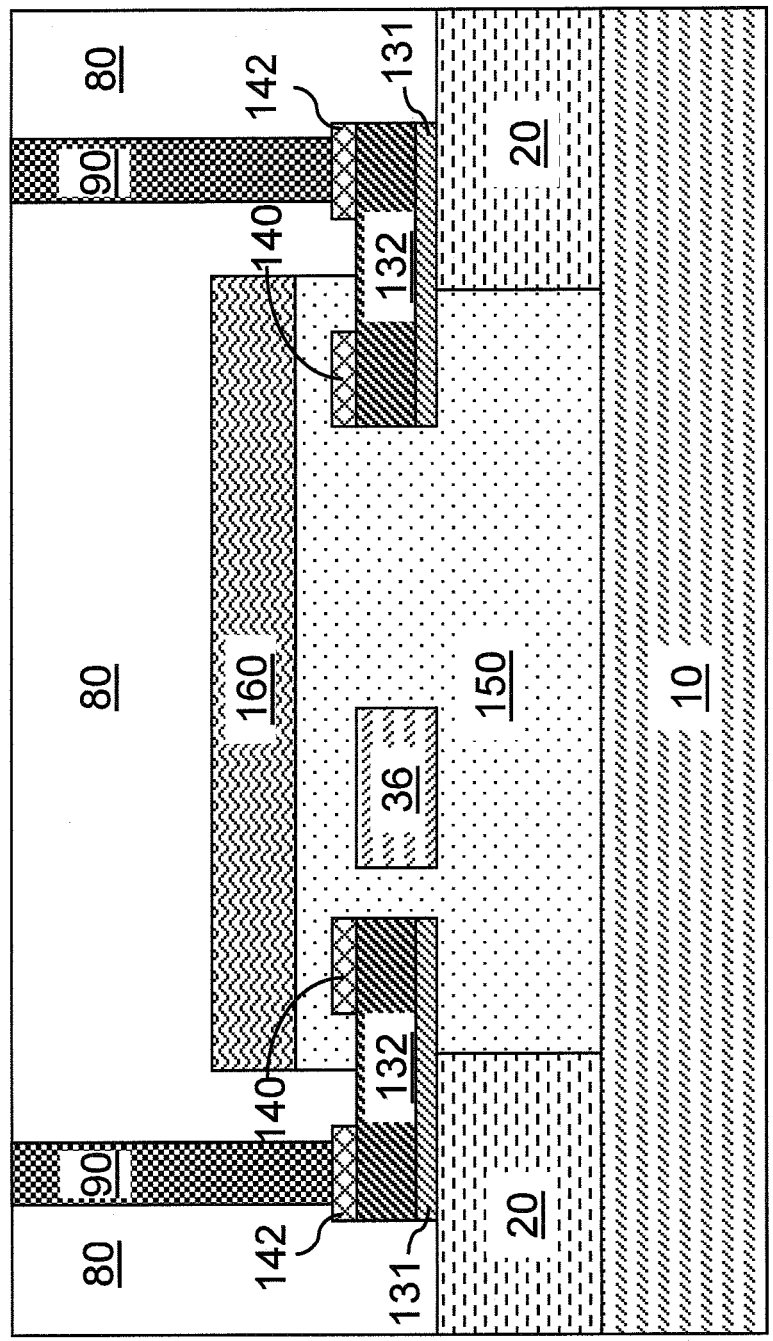
FIG. 19 is a vertical cross-sectional view of a fifth exemplary semiconductor structure.

Referring to FIG. 19, a fifth exemplary semiconductor structure according to a fifth embodiment of the present invention is derived from the second exemplary semiconductor structure by omitting formation of at least one compound semiconductor via 85.

Figure 20:
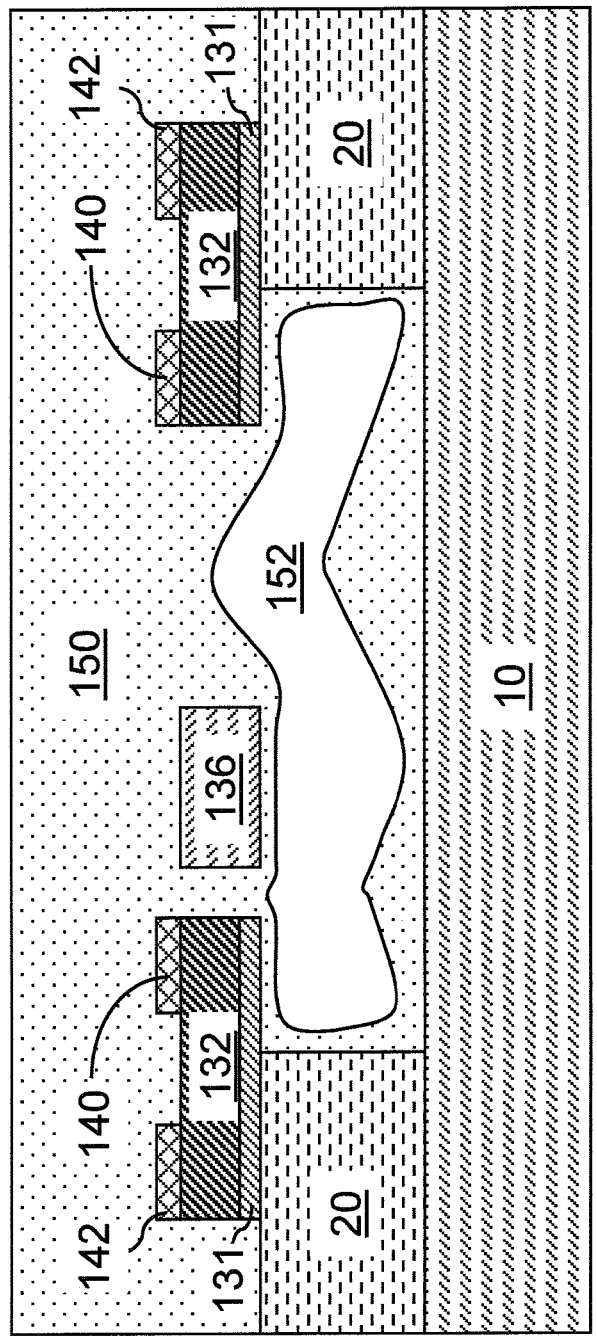
FIGS. 20 and 21 are sequential vertical cross-sectional views of a sixth exemplary semiconductor structure.

Referring to FIG. 20, a sixth exemplary semiconductor structure according to a sixth embodiment of the present invention is derived from the second exemplary semiconductor structure at a step corresponding to FIGS. 14A and 5B by removing the photoresist 147 and employing a non-conformal deposition process to form a low-k dielectric material portion 150. The material of the low-k dielectric material portion 150 may be the same as in the second embodiment. The non-conformal property of the deposition process employed to form the low-k dielectric material portion 150 deposits a low-k dielectric material over narrow portions of the of the semiconductor structures above the top surface of the buried insulator layer 20, i.e., between the at least one temperature control device (90, 142, 131, 132, 140, 133, 134, 144, 92) and the semiconductor waveguide 136. Thus a cavity 152 is formed within the low-k dielectric material portion 150.

Figure 21:
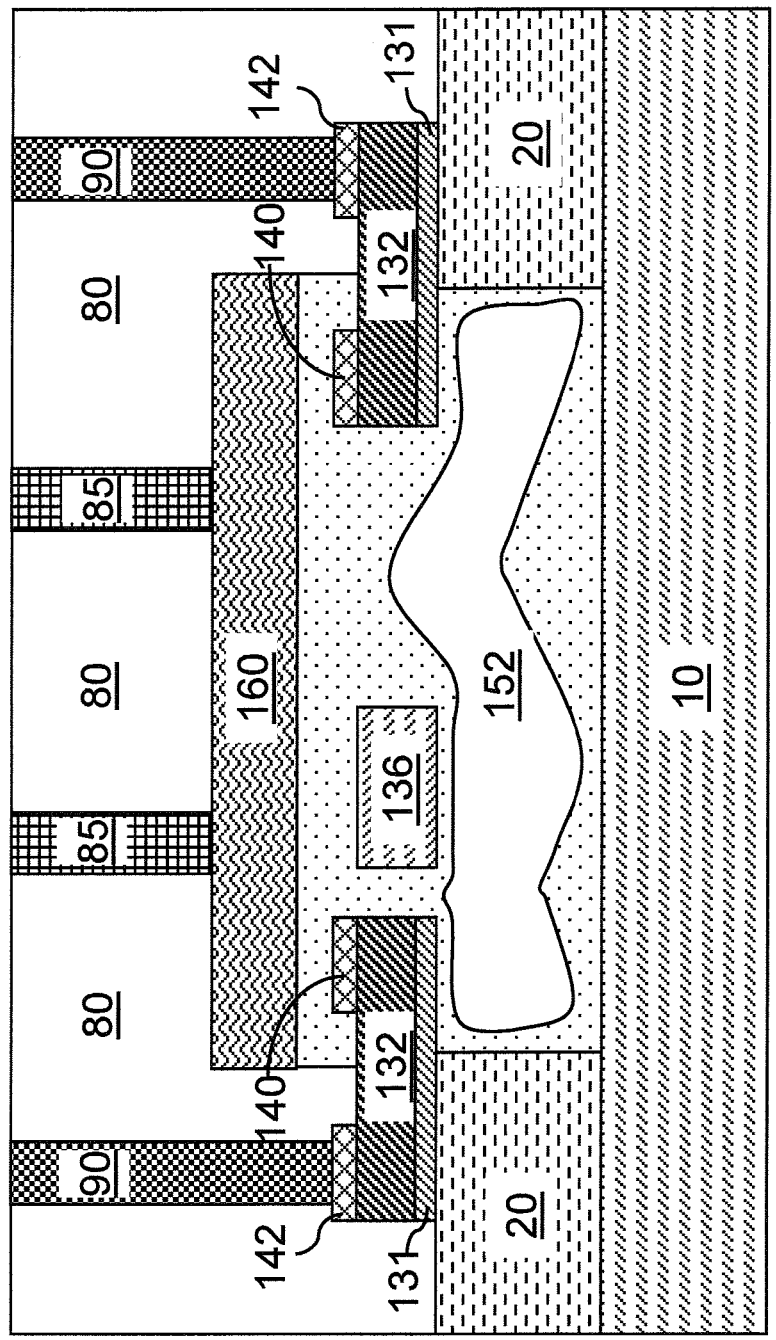

Referring to FIG. 21, processing steps corresponding to FIGS. 15A-7B of the second embodiment are performed on the sixth exemplary semiconductor structure. The cavity 152 may be under vacuum after processing, or may be filled with air or a gas. The cavity 152 has a dielectric constant that is substantially equal to 1.0. The cavity 152 has a lower thermal conductivity than the material of the buried insulator layer 20, thereby increasing the thermal isolation of the at least one first metal semiconductor alloy portion 140 and the optoelectronic device 160 from the handle substrate 10. The at least one temperature control device (90, 142, 131, 132, 140, 133, 134, 144, 92) may be operated in the same manner as in the second embodiment to control the temperature of the optoelectronic device 160 and to regulate the performance of the optoelectronic device 160.

Figure 22:
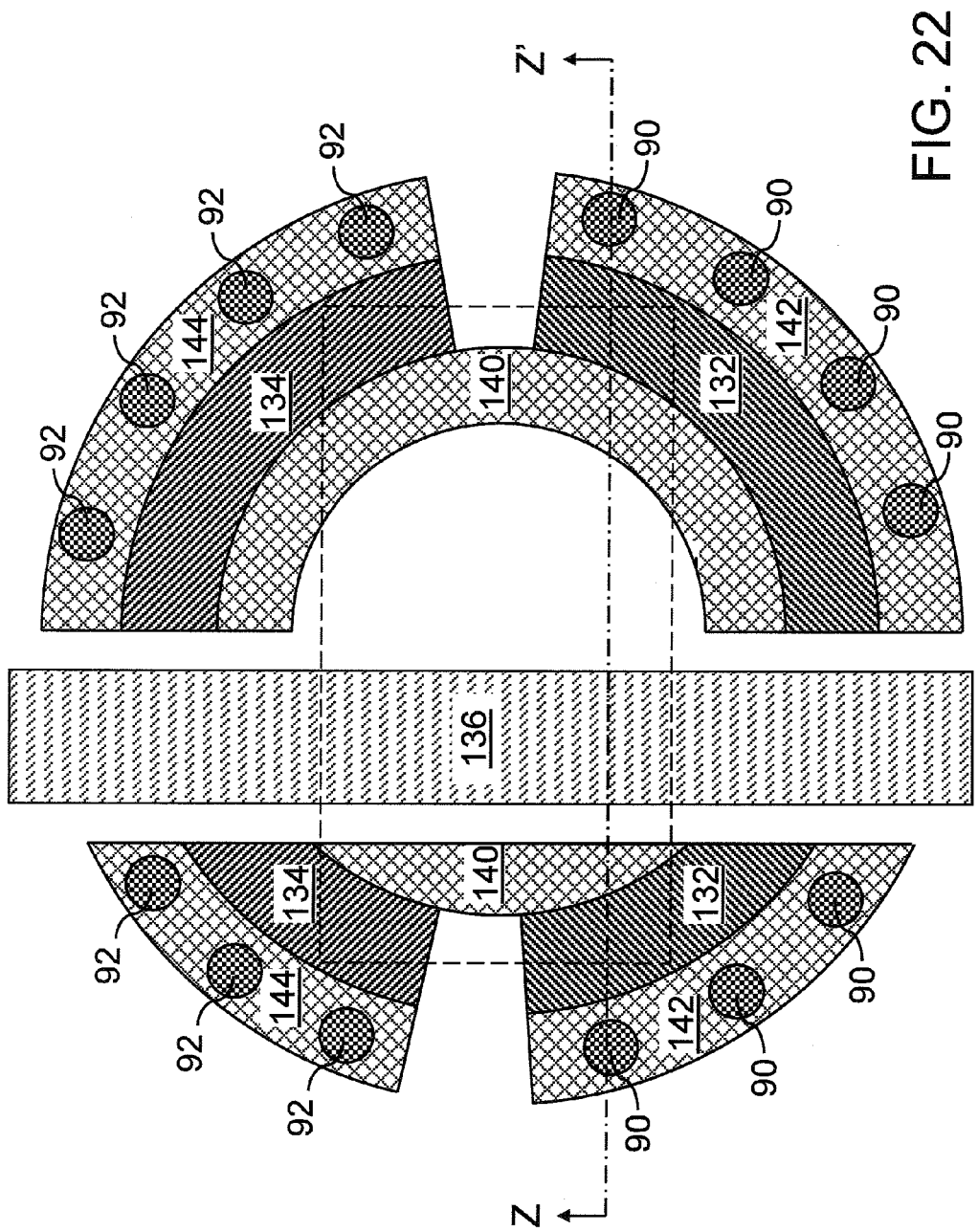
FIG. 22 is a top-down view of selected elements to demonstrate lateral geometrical relationship between the selected elements of a seventh exemplary semiconductor structure according to a seventh embodiment of the present invention.

Referring to FIG. 22, a seventh exemplary semiconductor structure according to a seventh embodiment of the present invention is shown. FIG. 111 is a top-down view of selected elements including p-doped semiconductor portions (131, 132), n-doped semiconductor portions (133, 134), first metal semiconductor alloy regions 140, second metal semiconductor alloy regions 142, third metal semiconductor alloy regions 144, first metal contact vias 90, second metal contact vias 92, and a semiconductor waveguide 136. The location of the optoelectronic device 160 is shown in a broken line. A vertical cross-sectional view along the plane Z-Z' is the same as FIG. 15A.

Each of the first metal semiconductor alloy regions 140 is located within a first annulus. Each of the p-doped semiconductor portions (131, 132) and n-doped semiconductor portions (133, 134) is located within a second annulus which encloses and abuts the first annulus. Each of the second metal semiconductor alloy regions 142 and the third metal semiconductor alloy regions 144 is located within a third annulus which encloses and abuts the second annulus. The p-doped semiconductor portions (131, 132), the n-doped semiconductor portions (133, 134), the first metal semiconductor alloy regions 140, the second metal semiconductor alloy regions 142, and the third metal semiconductor alloy regions 144 constitute two temperature control devices (90, 142, 131, 132, 140, 133, 134, 144, 92) between which a semiconductor waveguide 136 is located. An optoelectronic device 160 overlies portions of the two temperature control devices (90, 142, 131, 132, 140, 133, 134, 144, 92) and the semiconductor waveguide 136 as in the second embodiment. The two temperature control devices (90, 142, 131, 132, 140, 133, 134, 144, 92) may be operated in the same manner as in the second embodiment to control the temperature of the optoelectronic device 160 and to regulate the performance of the optoelectronic device 160.

In general, topological variations may be performed to the at least one temperature control devices (90, 142, 131, 132, 140, 133, 134, 144, 92 and optionally 30 and 138) to any of the exemplary semiconductor structures described above. Further, additional temperature control devices having a similar structure may be added to any of the exemplary semiconductor structures described above.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising a temperature control device and an optoelectronic device, said method including:
    forming a top semiconductor portion by patterning a top semiconductor layer of a semiconductor-on-insulator substrate, wherein an entirety of top semiconductor portion has a first thickness throughout upon formation and comprises:
    a primary top semiconductor portion having a semiconductor portion width;
    a pair of first laterally protruding top semiconductor portions having a greater width than said semiconductor portion width; and
    a pair of second laterally protruding top semiconductor portions having a greater width than said semiconductor portion width;
    forming a p-doped semiconductor in each of said pair of first laterally protruding top semiconductor portion and an n-doped semiconductor portion in each of said pair of second laterally protruding top semiconductor portions;
    forming a metal semiconductor alloy region directly on said p-doped semiconductor portion and said n-doped semiconductor portion, wherein said p-doped semiconductor portion, said n-doped semiconductor portion, and said metal semiconductor alloy region constitute a portion of a temperature control device;
    forming a current conduction path configured to pass current from said p-doped semiconductor portion, through said metal semiconductor alloy region, and to said n-doped semiconductor portion or from said n-doped semiconductor portion, through said metal semiconductor alloy region, and to said p-doped semiconductor portion; and
    forming an optoelectronic device comprising a semiconductor material, configured to manipulate electromagnetic radiation, and thermally coupled to said temperature control device.

2. The method of claim 1, wherein said optoelectronic device overlies said metal semiconductor alloy region.

3. The method of claim 1, further comprising removing a portion of a buried insulator layer underneath a sub-portion of said p-doped semiconductor portion and a sub-portion of said n-doped semiconductor portion to form a trench in said buried insulator layer.

4. The method of claim 3, further comprising filling said trench with a low dielectric constant (low-k) material having a dielectric constant less than 3.0, wherein said optoelectronic device is formed over said low-k material.

5. The method of claim 4, further comprising forming a cavity laterally abutting a remaining portion of said buried insulator layer by removing said low-k material selective to said remaining portion of said buried insulator layer.

6. The method of claim 1, further comprising a shallow trench isolation structure contacting a top surface of a buried insulator layer within said semiconductor-on-insulator substrate.

7. The method of claim 1, wherein an entirety of said top semiconductor portion is single crystalline.

8. The method of claim 1, further comprising forming a pair of recessed line trenches having a recess depth within said primary top semiconductor portion, wherein said recess depth is less than said first thickness.

9. The method of claim 8, wherein said optoelectronic device comprises a waveguide having a uniform width, and said waveguide is formed between said pair of recessed line trenches.

10. The method of claim 8, wherein sidewalls of said pair of first laterally protruding top semiconductor portions and sidewalls of said pair of second laterally protruding top semiconductor portions are physically exposed to said pair of recessed line trenches.

11. The method of claim 8, wherein said p-doped semiconductor portion is formed within one of said pair of first laterally protruding top semiconductor portions and a sub-portion of said primary top semiconductor portion that underlies one of said pair of recessed line trenches, and said n-doped semiconductor portion is formed within one of said pair of second laterally protruding top semiconductor portions and another sub-portion of said primary top semiconductor portion that underlies said one of said pair of recessed line trenches.

12. The method of claim 8, wherein said metal semiconductor alloy region is formed on a bottom surface of one of said pair of recessed line trenches.

13. The method of claim 1, wherein said p-doped semiconductor portion and said n-doped semiconductor portion laterally contact each other upon formation and have a p-n junction therebetween.

14. The method of claim 13, further comprising forming a waveguide having a uniform width, wherein said waveguide is laterally spaced from said p-doped semiconductor portion and said n-doped semiconductor portion.

15. The method of claim 1, further comprising:
    forming another metal semiconductor alloy region on said p-doped semiconductor portion concurrent with formation of said metal semiconductor alloy region; and
    forming yet another metal semiconductor alloy region on said n-doped semiconductor portion concurrently with formation of said metal semiconductor alloy region.

16. The method of claim 15, wherein each of said another metal semiconductor alloy region and said yet another metal semiconductor alloy region is spaced from said metal semiconductor alloy region.

17. The method of claim 1, wherein said optoelectronic device comprises a waveguide having a uniform width and formed by patterning said top semiconductor layer, and said method further comprises suspending said waveguide above a handle substrate of said semiconductor-on-insulator substrate by removing a portion of a buried insulator layer from underneath said waveguide.

18. The method of claim 17, further comprising depositing a dielectric material employing a non-conformal deposition method over said waveguide after suspending said waveguide, whereby a cavity is formed within a portion of said deposited dielectric material underneath said waveguide.

* * * * *